United States Patent [19]
Remmerie et al.

[11] Patent Number: 4,779,125
[45] Date of Patent: Oct. 18, 1988

[54] SEMICONDUCTOR DEVICE AND ARRANGEMENT

[75] Inventors: Guido P. T. C. Remmerie, Rumst; Luc J. L. Van Den Bossche, Lebbeke; Daniel F. J. Van De Pol, Zoersel, all of Belgium

[73] Assignee: Alcatel N.V., Amsterdam, Netherlands

[21] Appl. No.: 819,089

[22] PCT Filed: May 1, 1985

[86] PCT No.: PCT/EP85/00193
§ 371 Date: Jan. 2, 1986
§ 102(e) Date: Jan. 2, 1986

[87] PCT Pub. No.: WO85/05224
PCT Pub. Date: Nov. 21, 1985

[30] Foreign Application Priority Data
May 2, 1984 [EP] European Pat. Off. ............ 84200608

[51] Int. Cl.⁴ .................. H01L 29/08; H01L 29/743
[52] U.S. Cl. ......................................... 357/38; 357/36
[58] Field of Search ........................... 357/36, 38

[56] References Cited
U.S. PATENT DOCUMENTS

| | | | |
|---|---|---|---|
| 3,394,037 | 7/1968 | Robinson | 357/52 X |
| 4,115,797 | 9/1978 | Hingargh et al. | 357/36 X |
| 4,199,774 | 4/1980 | Plummer | 357/38 X |
| 4,213,067 | 7/1980 | Spellman et al. | 357/38 X |
| 4,361,846 | 11/1982 | Tsukuda | 357/38 X |
| 4,546,401 | 10/1985 | Svedberg | 357/23.1 X |
| 4,574,209 | 4/1986 | Lade et al. | 357/39 X |
| 4,586,073 | 4/1986 | Hartman et al. | 357/38 X |
| 4,605,872 | 8/1986 | Rung | 357/38 X |

FOREIGN PATENT DOCUMENTS

| | | |
|---|---|---|
| 0091094 | 10/1983 | European Pat. Off. . |
| 0091686 | 10/1983 | European Pat. Off. . |
| 0097866 | 1/1984 | European Pat. Off. . |
| 0111803 | 6/1984 | European Pat. Off. . |
| 0118785 | 9/1984 | European Pat. Off. . |
| 0121096 | 10/1984 | European Pat. Off. . |
| 2625917 | 12/1976 | Fed. Rep. of Germany . |
| 2625917 C3 | 12/1979 | Fed. Rep. of Germany . |
| 0897772 | 3/1984 | France . |
| 162186 | 8/1971 | New Zealand . |
| 163747 | 4/1973 | New Zealand . |

OTHER PUBLICATIONS

Plummer, J. D. and Scharf, B. W., "Insulated-Gate Planar Thyristors: I-Structure and Basic Operation", IEEE Trans. on Electron Devices, vol. ED-27 (1980), Feb., 380-386.

Primary Examiner—Andrew J. James
Assistant Examiner—Sara W. Crane
Attorney, Agent, or Firm—Christie, Parker & Hale

[57] ABSTRACT

The semiconductor device and arrangement include a thyristor switch (T1-T3) with associated turn-on (DM) and turn-off (PM1, PM2) devices. The thyristor switch includes a PNP transistor (T1) and one or two NPN transistors (T2, T3) each of which has an emitter constituted by a path of separate regions (115) of N+ material each completely surrounded by P+ material of a zone (110). This path either has a boat shape and partly surrounds and is located at a constant distance of a substantially rectangular zone (109) of P+ material constituting the emitter of the PNP transistor (T1), or has an S-shape and is located at a constant distance of the S-shaped emitter of the PNP transistor (T1).

34 Claims, 21 Drawing Sheets

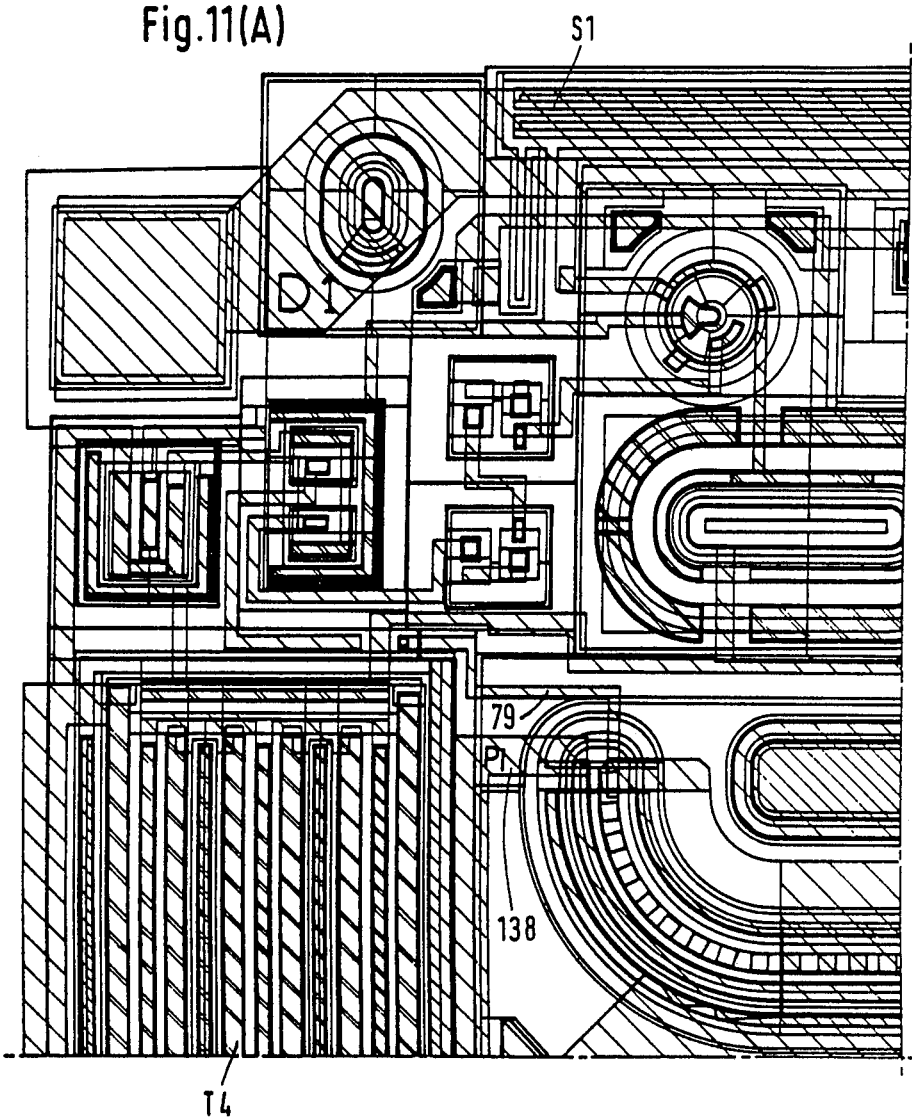

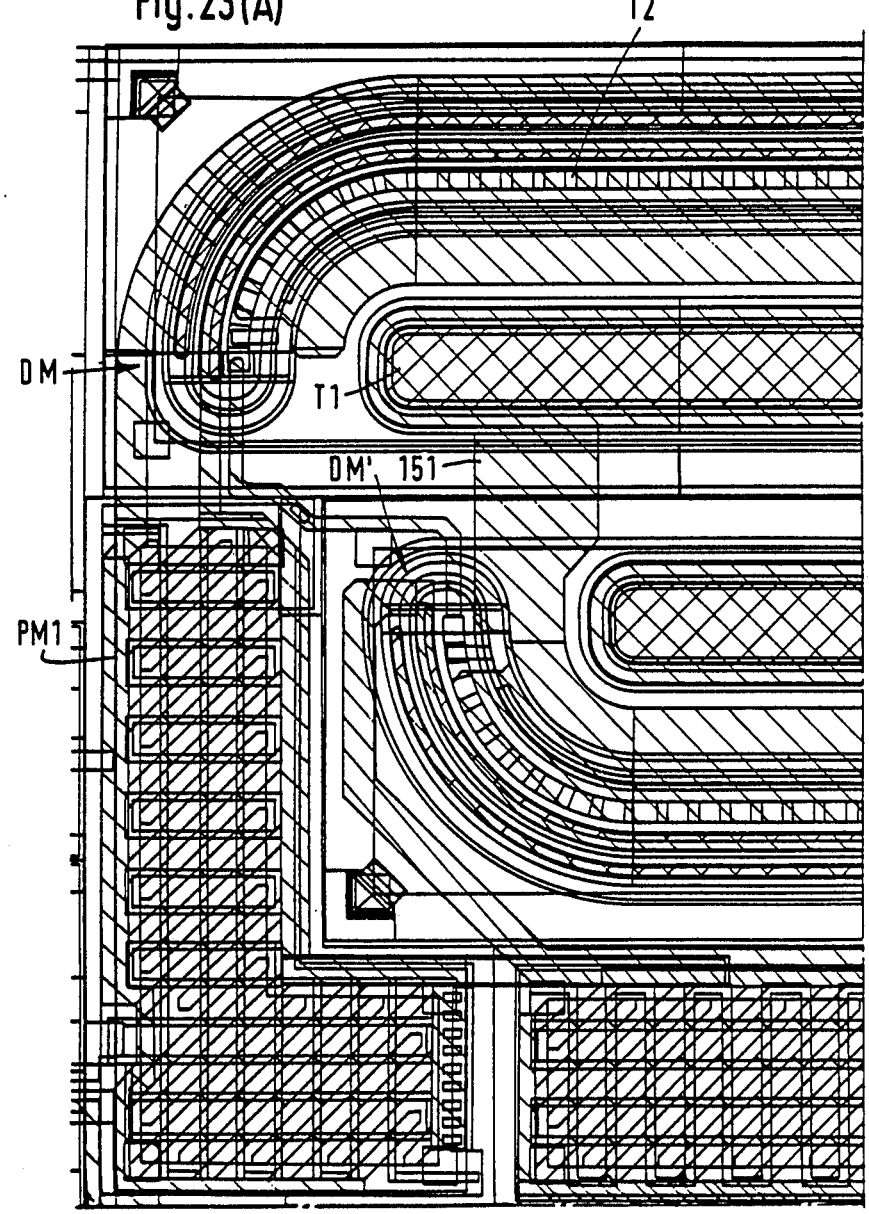

SEMICONDUCTOR DEVICE AND ARRANGEMENT

The present invention relates to a semiconductor device including at least one region of a highly doped material of a first conductivity type embedded in a well of a material of a second conductivity type to allow current flow between said well and said region.

Such a semiconductor device is already known from the article "Insulated-Gate Planar Thyristors: I-Structure and Basic Operation" by J. D. Plummer et al, published in IEEE Transactions on Electronic Devices, Vol. ED-27, No. 2, Feb. 1980, pp. 380–387 and more particularly FIG. 11 thereof.

This known device includes a thyristor comprising a PNP transistor and an NPN transistor which are interconnected between two terminals constituting respective emitters of said transistors, the base-to-emitter junction of the NPN transistor being shunted by a turn-off PMOS transistor and by a so-called pinched trigger resistance. The collector of the PNP transistor, the base of the NPN transistor and the source of the PMOS transistor are constituted by the above mentioned well which comprises P material and the emitter of the NPN transistor is constituted by the above mentioned region which comprises highly doped N material, i.e. N+ material.

In this known device, upon the PMOS transistor being made conductive to turn off the thyristor, current is drawn from the P well below the region of N+ material to the channel and drain of the PMOS transistor, i.e. from the commoned collector of the PNP transistor, the base of the NPN transistor and the source of the PMOS transistor to the channel and drain of this transistor. The current able to be interrupted by this PMOS transistor is reduced because the P well has a relatively high resistance connected in series with the source of the PMOS transistor.

An object of the present invention is to provide a semiconductor device of the above type but which does not present such a drawback, i.e. which permits a higher current to be diverted or turned off.

According to the invention this object is achieved due to the fact that in said well said region is at least partially surrounded by a zone of a highly doped material of said second conductivity type to allow current flow between said well and said zone.

Another characteristic feature of the present semiconductor device is that said well comprises P-material, said region comprises N+ material and said zone comprises P+ material.

A further characteristic of the present invention is that it includes a thyristor comprising a PNP transistor and a NPN transistor which are interconnected between two terminals constituting respective emitters of said transistors, the base-to-emitter junction of said NPN transistor being shunted by a turn-off device, and that the collector of said PNP transistor and the base of said NPN transistor are constituted by said well, the emitter of said NPN transistor is constituted by said region and said zone constitutes an input electrode of said turn-off device.

Due to an input electrode of the turn-off device being constituted by a zone of P+ material which at least partially surrounds the region of N+ material, upon operation of the turn-off device current is derived from the P− well below this N+ region to the P+ well adjacent this N+ region.

Because of the lower resistance of the P+ well the turn-off device is able to interrupt a larger current.

Another characteristic feature of the present device is that said zone completely surrounds said region.

Still another characteristic feature of this device is that it includes a plurality of regions each completely surrounded by said zone.

In these cases a still lower resistance path is formed for the current leaving the P− well and therefore the device is able to interrupt a still larger current.

Another advantage of the present semiconductor device is that it does not require the use of an above mentioned additional pinched trigger resistance.

Yet another characteristic of the present device it that said turn-off device is constituted by a PMOS transistor.

Also another characteristic of the present device is that $$I = \frac{0.5 (b1 + 1)}{RE (b1 - 1/b2)}$$

wherein
 I is the maximum current able to be interrupted by said PMOS transistor;
 b1 and b2 are the current amplification factors of said PNP and NPN transistors at said current respectively;
 RE is the combined resistance of the collector of said PNP transistor, of the base of said NPN transistor and of the source-to-drain path of said PMOS transistor.

The present invention also relates to a semiconductor arrangement including at least one semiconductor device with a thyristor switch to which a turn-on device and a turn-off device are associated.

Such a semiconductor arrangement is already known from the Belgian Pat. No. 897772.

In accordance with the above and other characteristics, a semiconductor arrangement of this type has been designed which includes two identical semiconductor devices which are integrated in a same isolated tub and together cover a substantially square area. This area comprises two interpenetrating portions each including parts of both the devices. More particularly, the emitters of the two bipolar transistors forming the thyristor switch of each device are constituted by interpenetrating S-shaped surfaces belonging to different portions and the remaining surfaces of these portions are substantially occupied by the turn-off devices. This means that the dimensions of the emitters of the two bipolar transistors and of the turn-off device of each semiconductor device are mutually dependent. As a consequence, when an existing arrangement has to be modified, while maintaining a similar shape for the area covered thereby, in order that each turn-off device should be able to switch-off a relatively higher current, it is not sufficient to make the surface of this transistor correspondingly higher. Indeed, in this case also the surfaces of the emitter of the bipolar transistors of each semiconductor device increase and the same is true for their above mentioned current amplification factors b1 and b2 so that the current I able to be switched off then decreases according to the last mentioned formula.

Another object of the present invention is to provide a semiconductor arrangement of the above type but which enables a more independent choice of its components.

According to the invention this object is achieved due to the fact that in each device said thyristor switch and said turn-on device are integrated in an electrically isolated first tub, and said turn-off device is integrated in an electrically isolated second tub.

Because the turn-off device is put in a separate tub, its dimensions can be given an optimum value independently from those of the thyristor switch and the turn-on device of the semiconductor device. Because the latter components of the devices of the arrangement are also put in separate tubs the dimensions of these components of each device can also be chosen in an optimum way independently from the corresponding components of the other semiconductor device(s).

Another characteristic feature of the present semiconductor device is that said thyristor switch includes a first transistor having an elongated emitter, as well as one or more second transistors having emitters constituted by a plurality of individual emitter elements which at least partly surround said elongated emitter and are located at a substantially constant distance thereof.

In this way the emitter surfaces and hence the current amplification factors b1 and b2 of both transistors of each device may be given an optimum value. More particularly, b1 may be chosen so as to enable the required current to be switched-off and b2 may be chosen so as to provide a suitable ON resistance for the semiconductor device without limiting the last mentioned current value.

The above mentioned and other objects and features of the invention will become more apparent and the invention itself will be best understood by referring to the following description of embodiments taken in conjunction with the accompanying drawings wherein.

Figure 1:
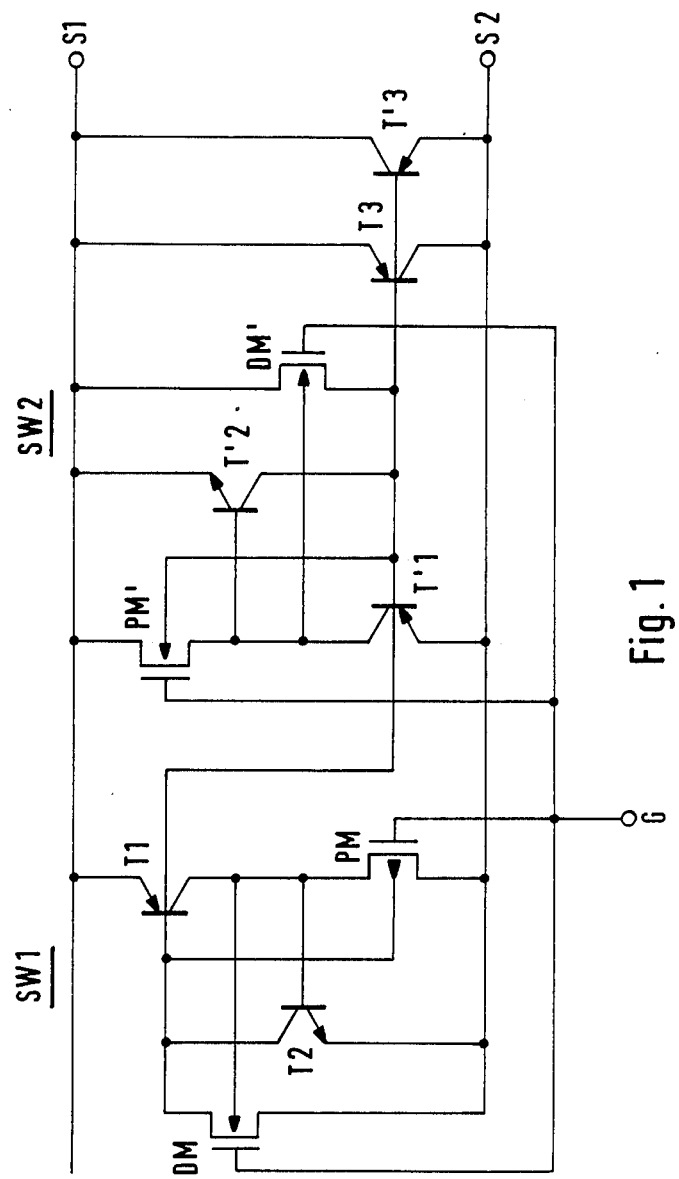
FIG. 1 represents the equivalent electrical circuit of a semiconductor device according to the invention.
Figure 3:
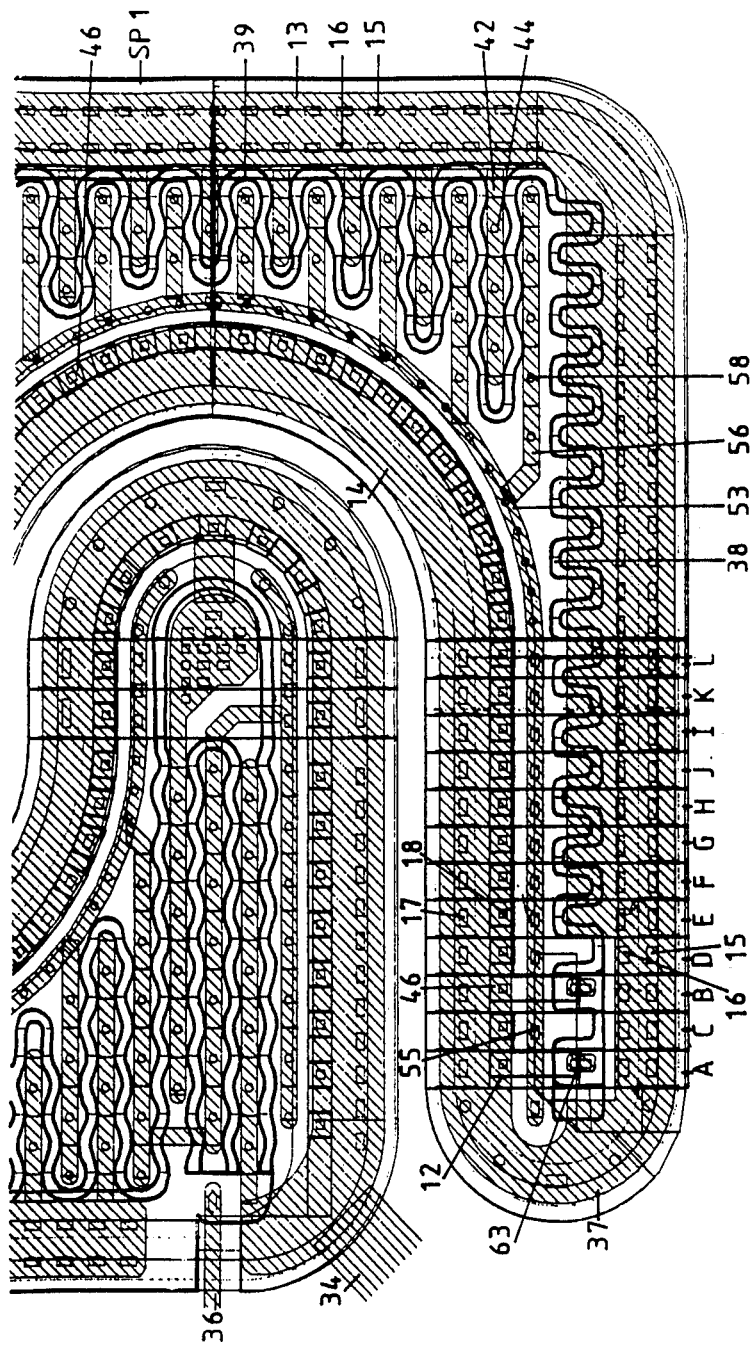
Figure 4:
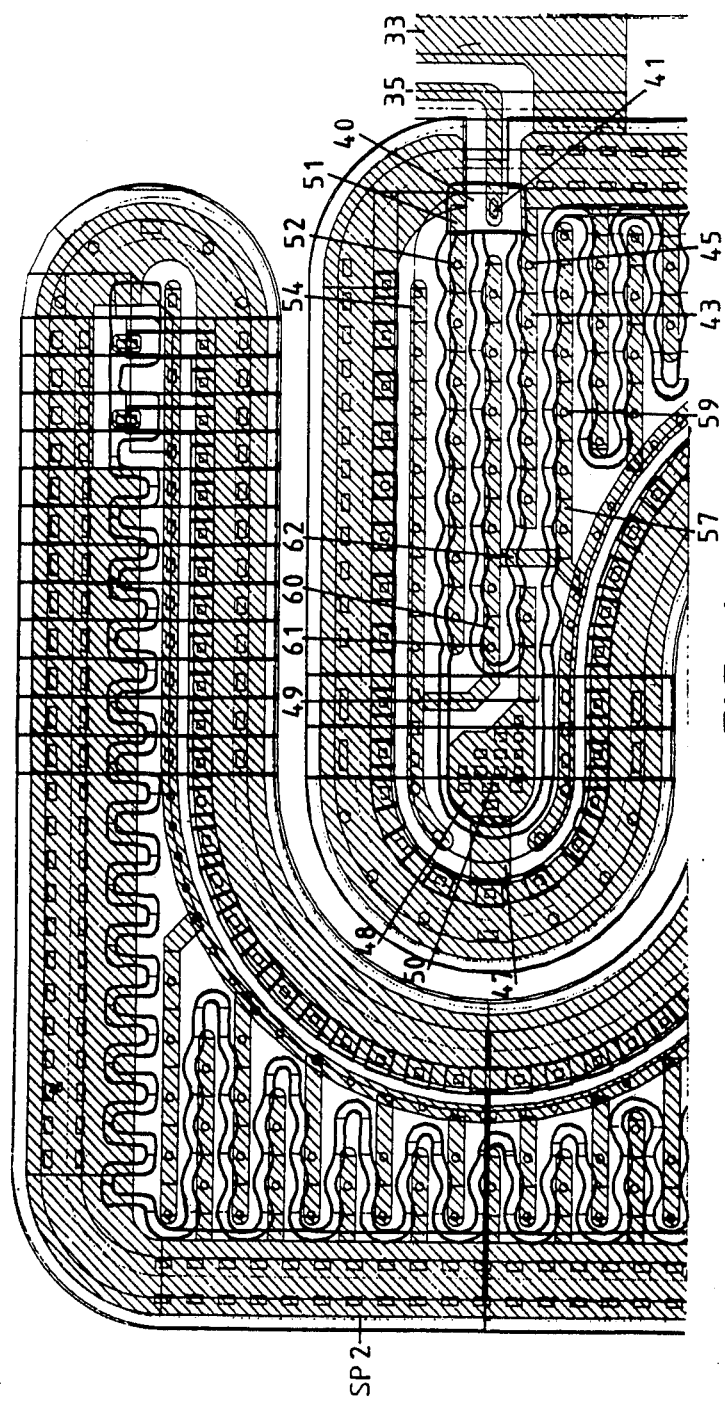
Figure 5:
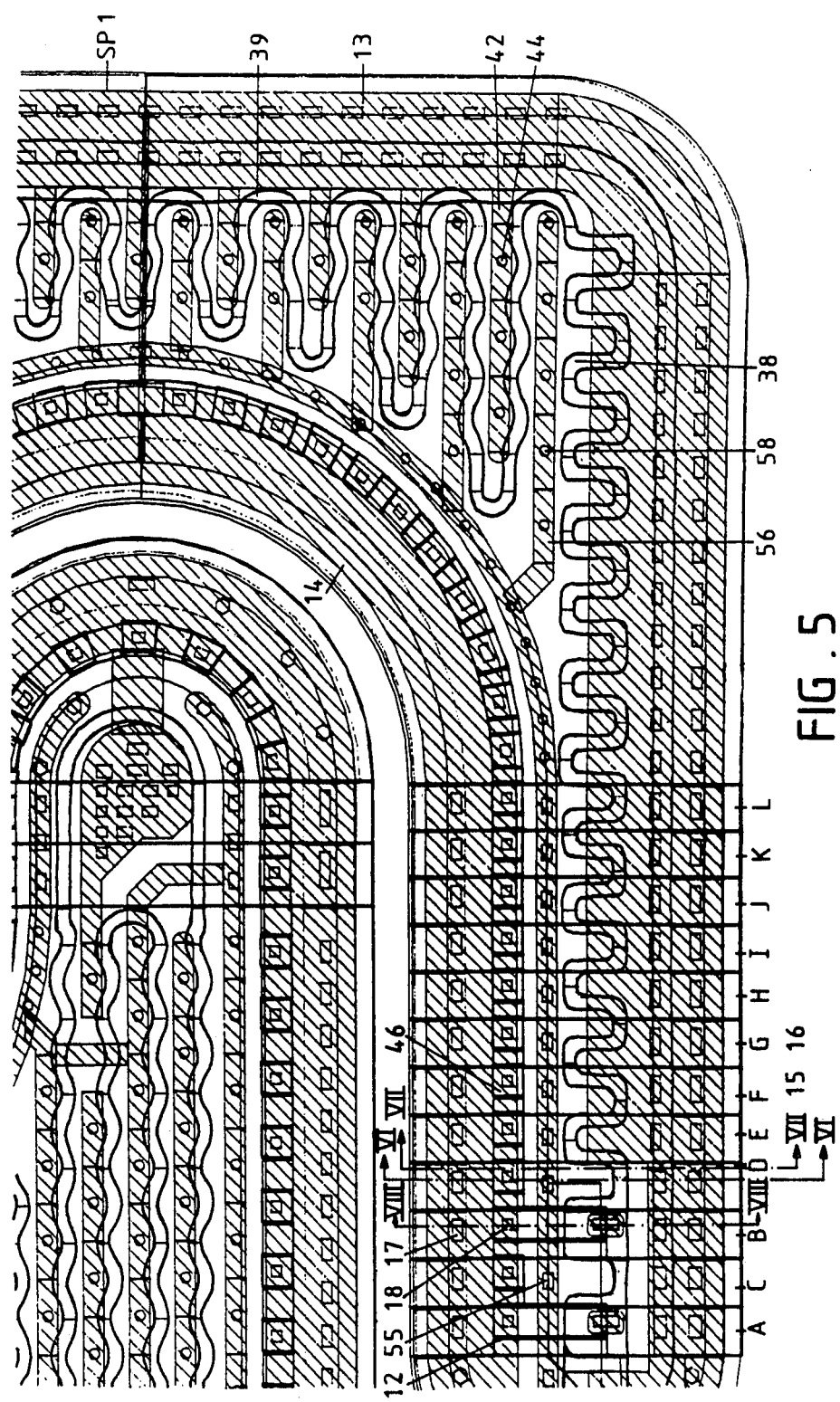
Figure 6:
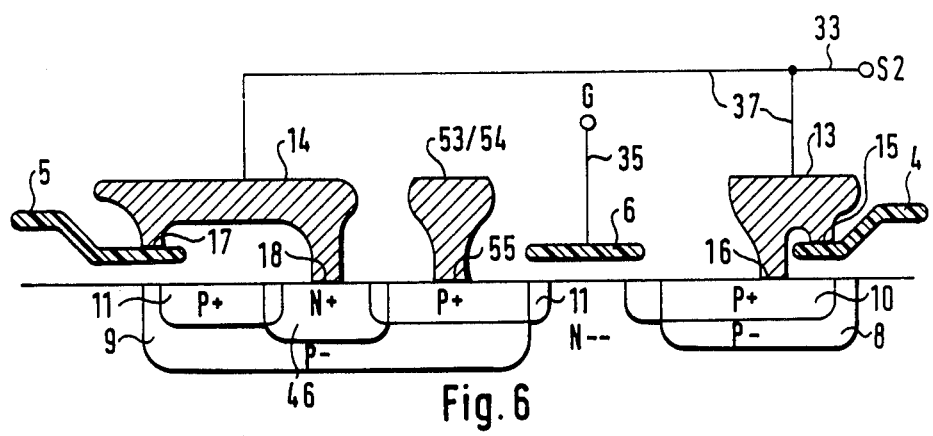
Figure 7:
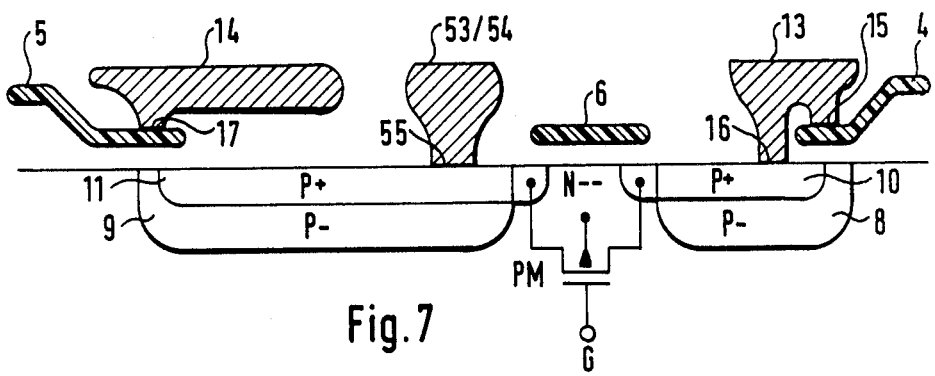
Figure 8:
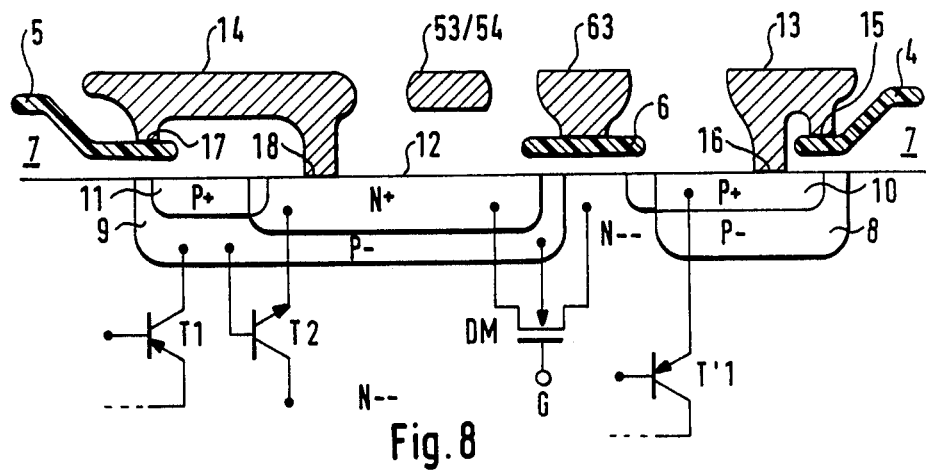
Figure 9:
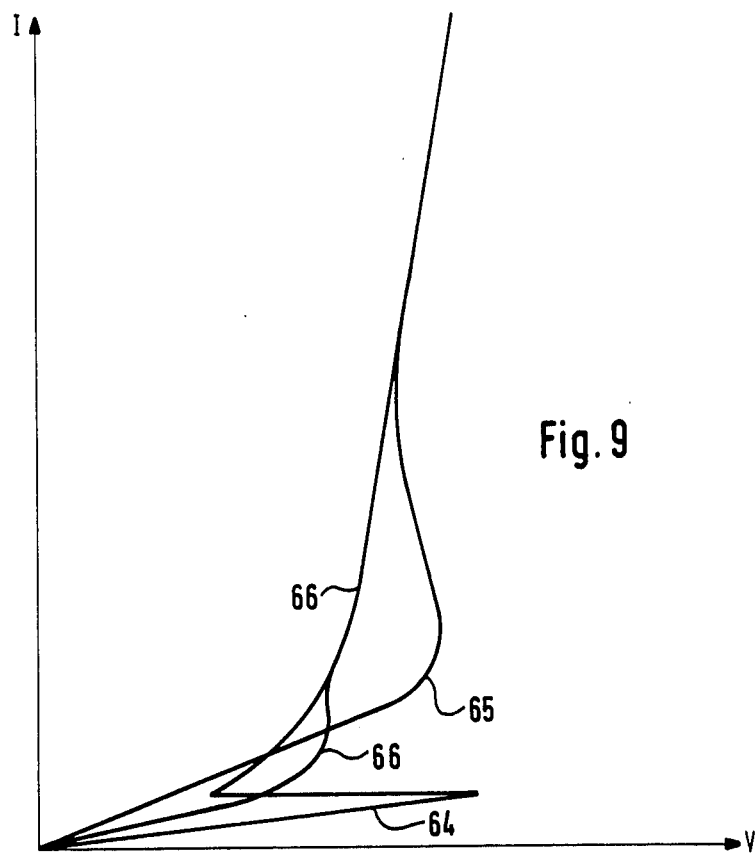
Figure 10:
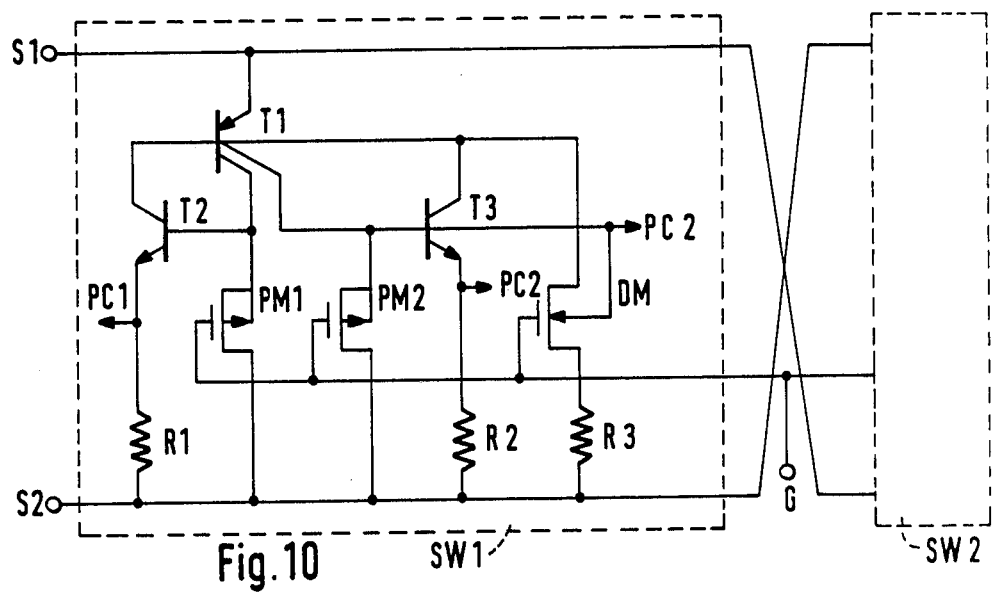
Figure 11B:
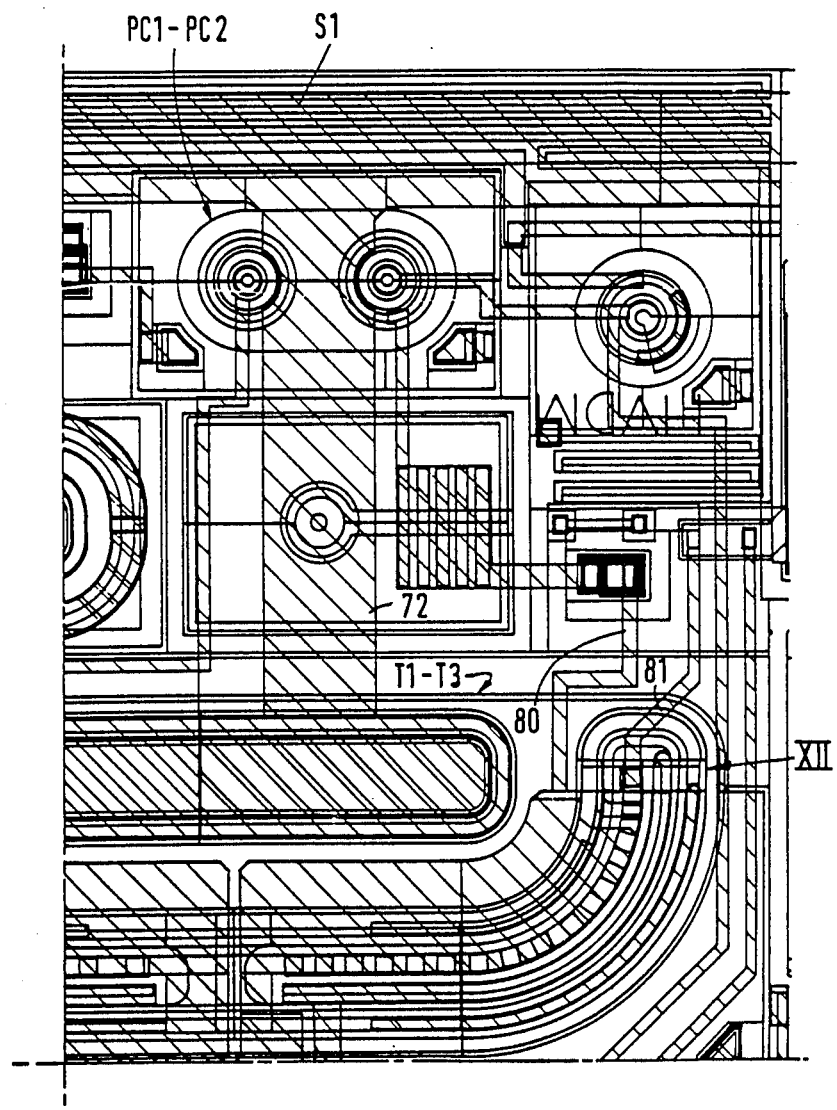
Figure 11C:
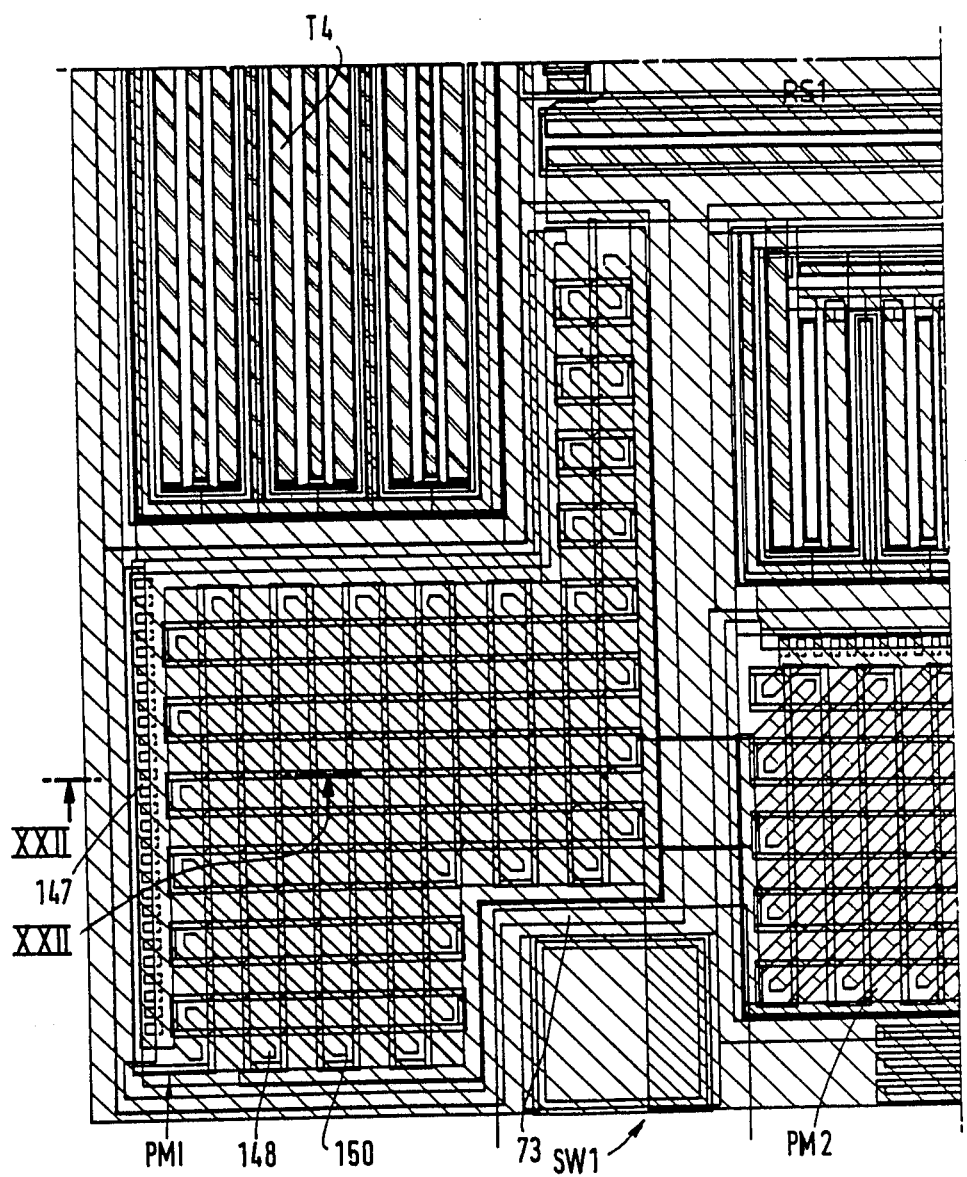
Figure 11D:
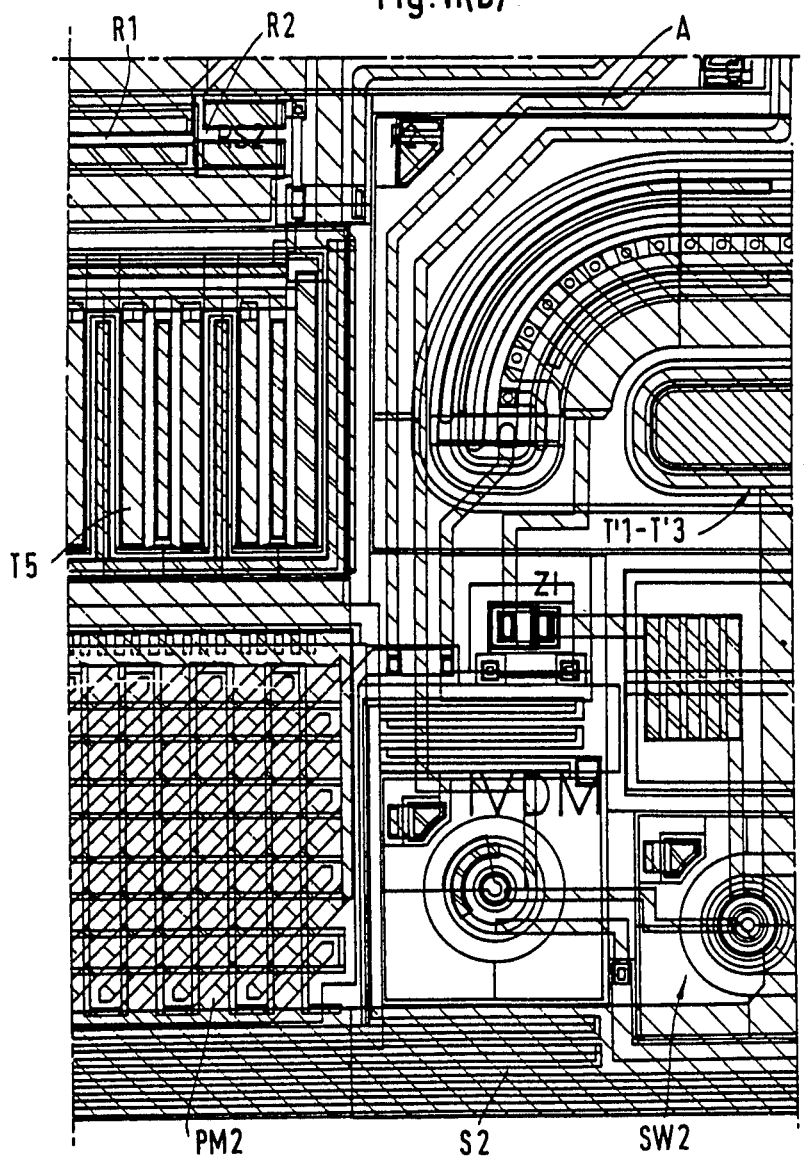
Figure 12:
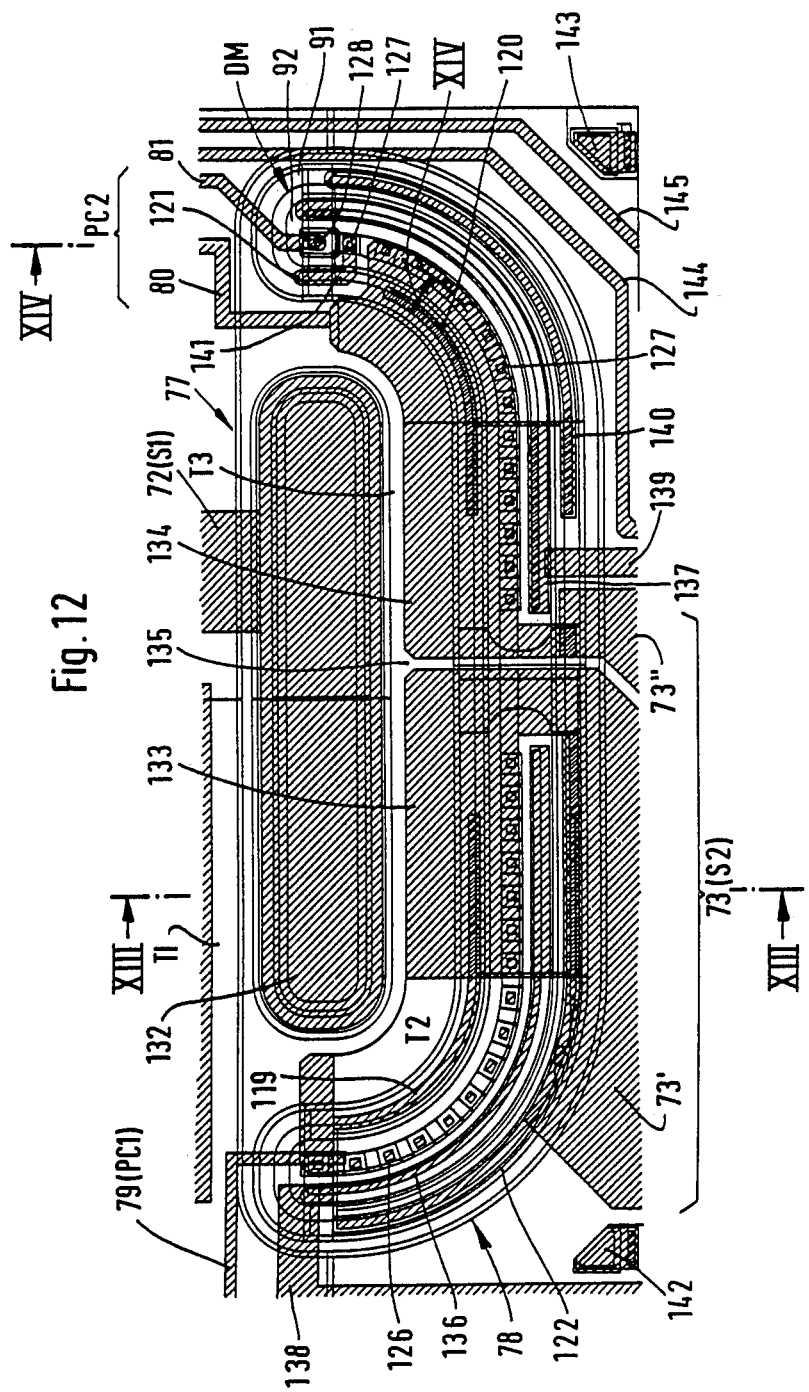
Figure 13:
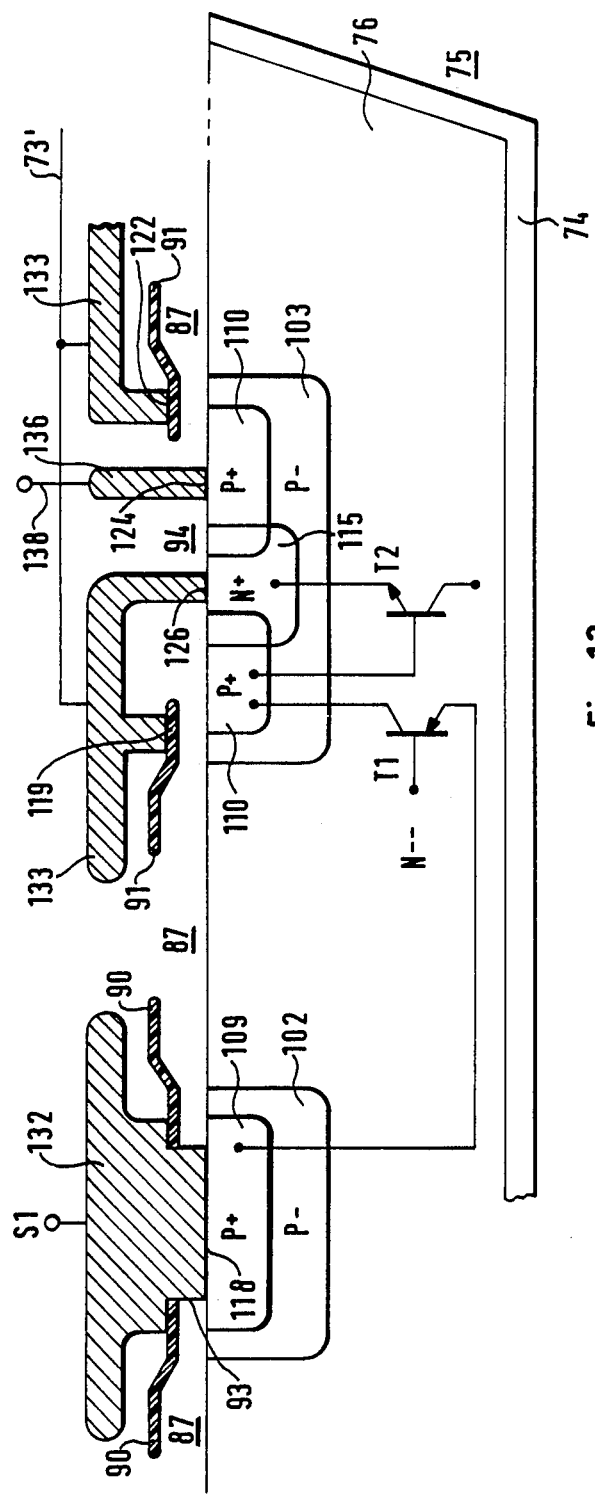
Figure 14:
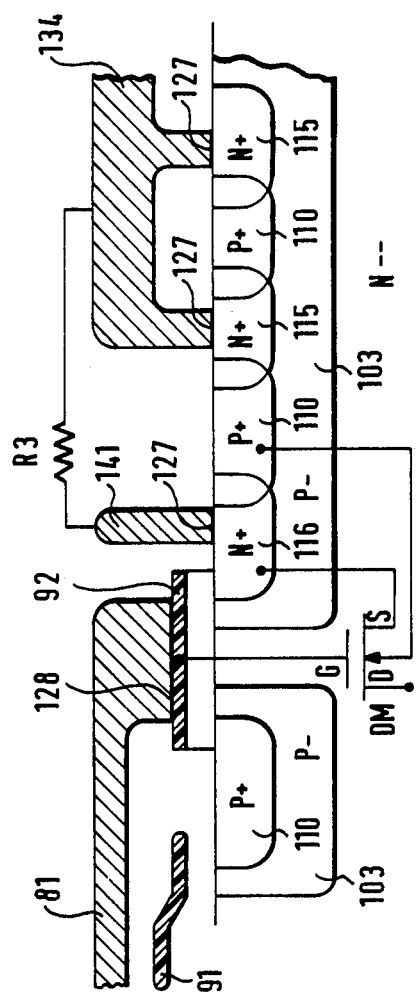
Figure 15:
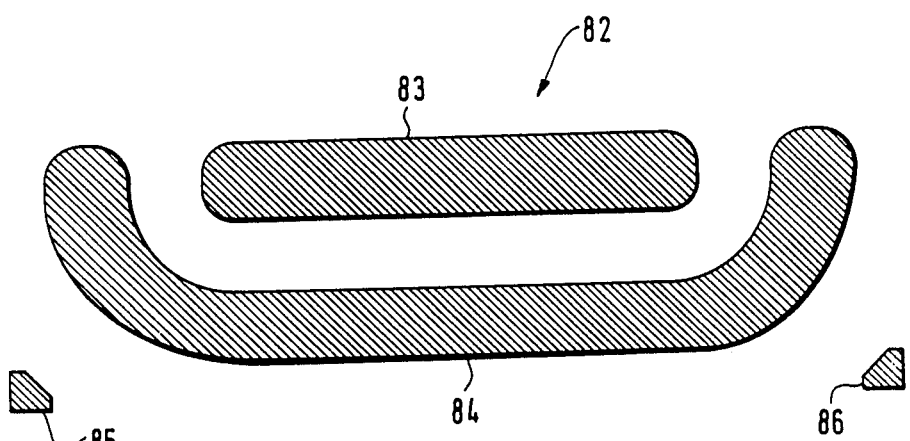
Figure 22:
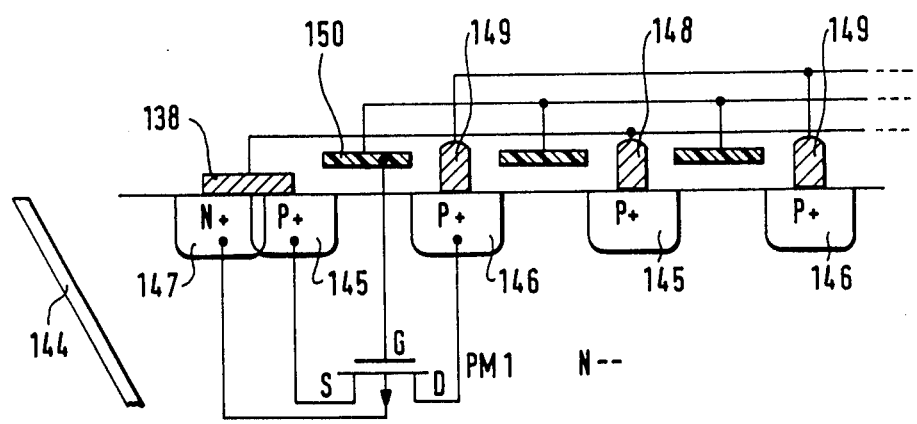
Figure 23B:
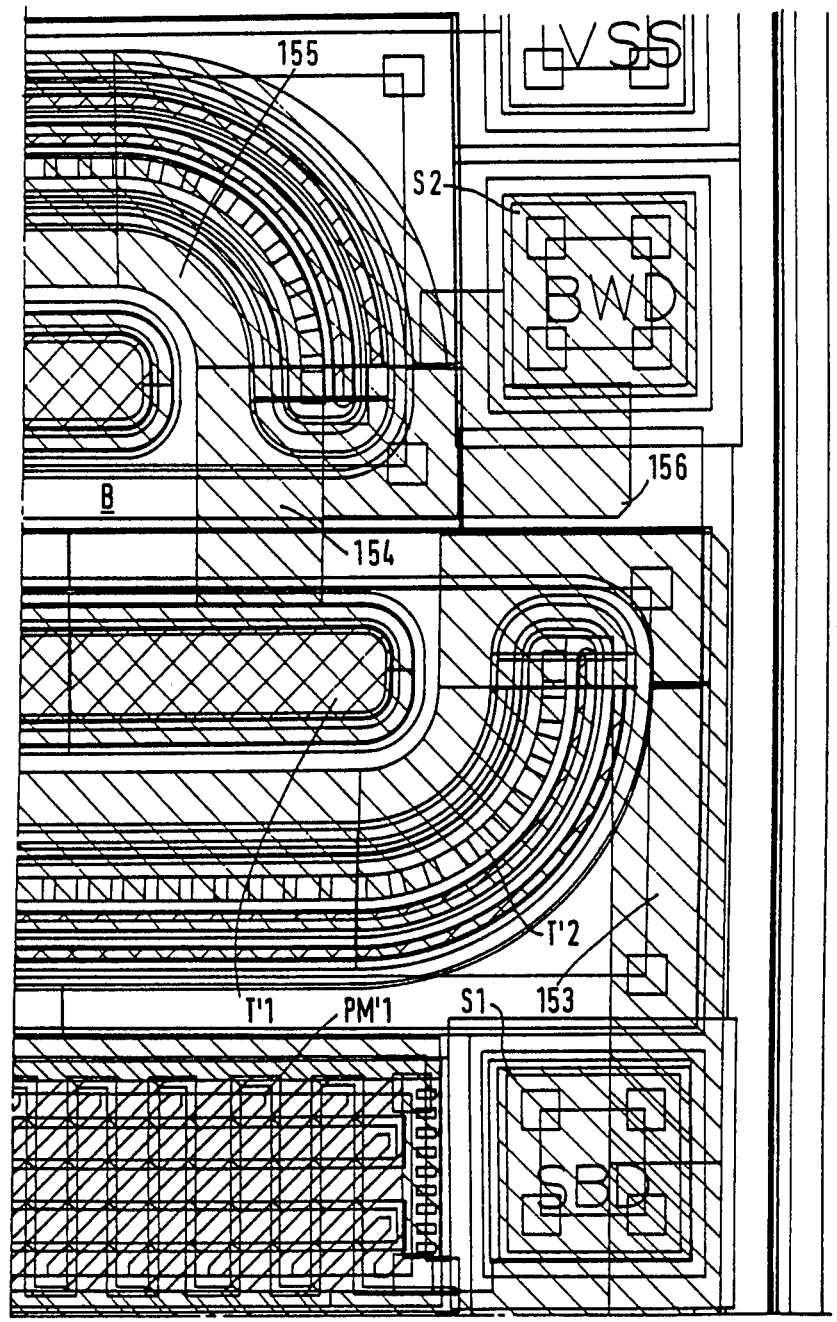
Figure 23C:
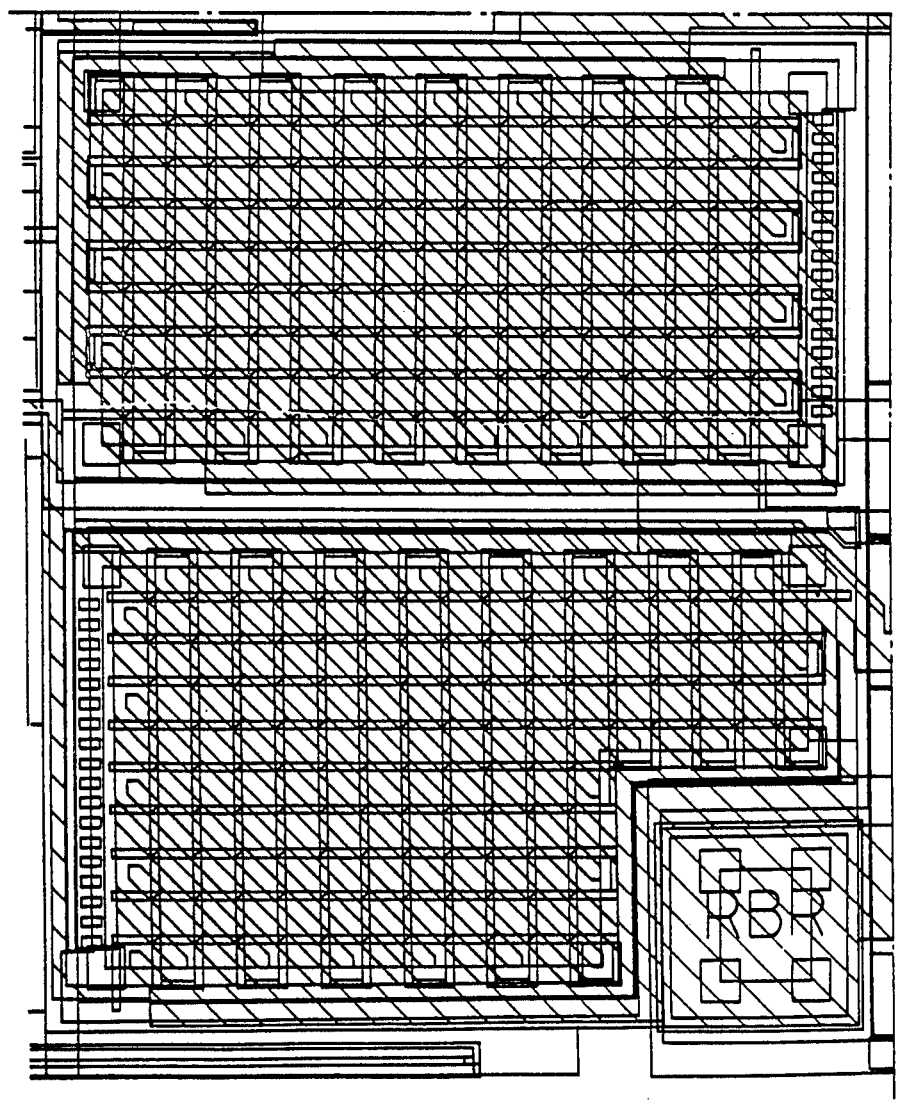
Figure 23D:
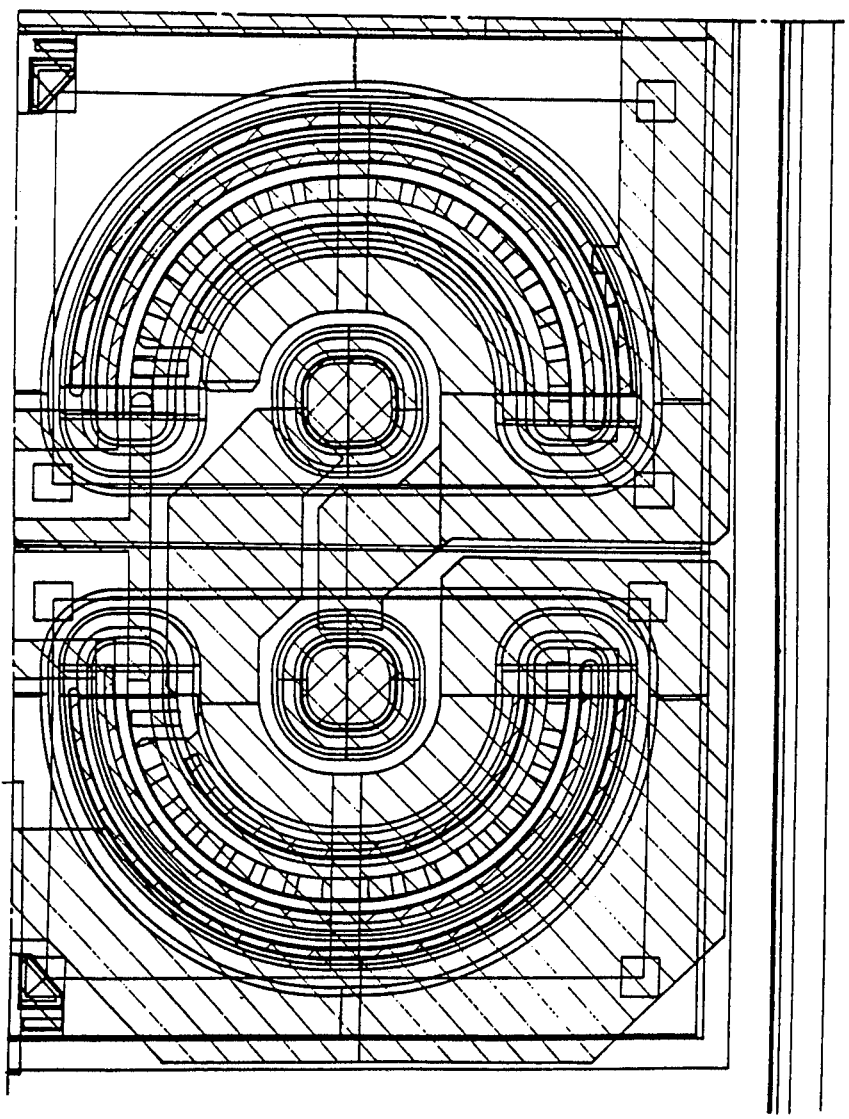

FIGS. 3 and 4 together, with FIG. 4 on top, represent a plan view of a lay-out of another embodiment of such a device;

FIG. 5 shows part of FIG. 3 on an enlarged scale;

FIGS. 6, 7 and 8 are cross-sections along lines VI—VI, VII—VII and VIII—VIII of FIG. 4 respectively, however with distorted dimensions;

FIG. 9 shows possible operation diagrams of the device of FIG. 1;

FIG. 10 represents the equivalent circuit of a semiconductor device of another type than those shown in FIGS. 1 to 9;

FIG. 11 is a plan view of a part of the lay-out of such a semiconductor device provided with protection circuitry;

FIG. 12 represents part XII of FIG. 11 on a larger scale;

FIGS. 13 and 14 are cross-sections along lines XIII—XIII and XIV—XIV of FIG. 12, however with distorted dimensions;

FIGS. 15 to 21 show various somewhat distorted masks used to integrate the part of the device represented in FIG. 12;

FIG. 22 is a cross-section along line XXII—XXII of FIG. 11, however with distorted dimensions;

FIG. 23 is a plan view of a part of the lay-out of a semiconductor device of the type shown in FIG. 10 and not provided with protection circuitry.

The electrical circuit shown in FIG. 1 includes two electronic semiconductor switches or gates SW1 and SW2 which are identical but connected in anti-parallel between terminals S1 and S2. These switches have a common gate terminal G and are already the subject of the above mentioned Belgian Pat. No. 897772.

Switch SW1 includes PNP transistor T1, NPN transistor T2, parasitic PNP transistor T, DMOS transistor DM and PMOS transistor PM. The transistors T1 and T2 together form a thyristor which may be triggered to its conductive condition by transistor DM and be turned off by means of transistor PM, as will be explained later.

Likewise switch SW2 includes transistors T'1, T'2, T', DM' and PM'.

As disclosed in the above Belgian patent, switch SW1 is operated when terminal S1 is at a higher voltage than terminal S2 and when a suitable positive voltage is applied to the common gate electrode G of SW1 and SW2. The same is true for SW2 when S2 is at a higher voltage than S1.

When for instance S1 is at a sufficiently high voltage with respect to S2 and gate electrode G is activated, then both DM' and DM which are connected in series between S1 and S2 (with DM' shunting T1) become conductive. Transistor T1 becomes conductive when the voltage drop across DM' reaches 0.7 volts. Once transistor T1 has become conductive it is followed by T2 and both transistors then sustain each other's operation. To turn off the switch a suitable negative voltage has to be applied to transistor PM because when the latter becomes conductive it draws current from the base of T2 and thus brings this transistor in the non-conductive condition followed by T1.

Figure 2:
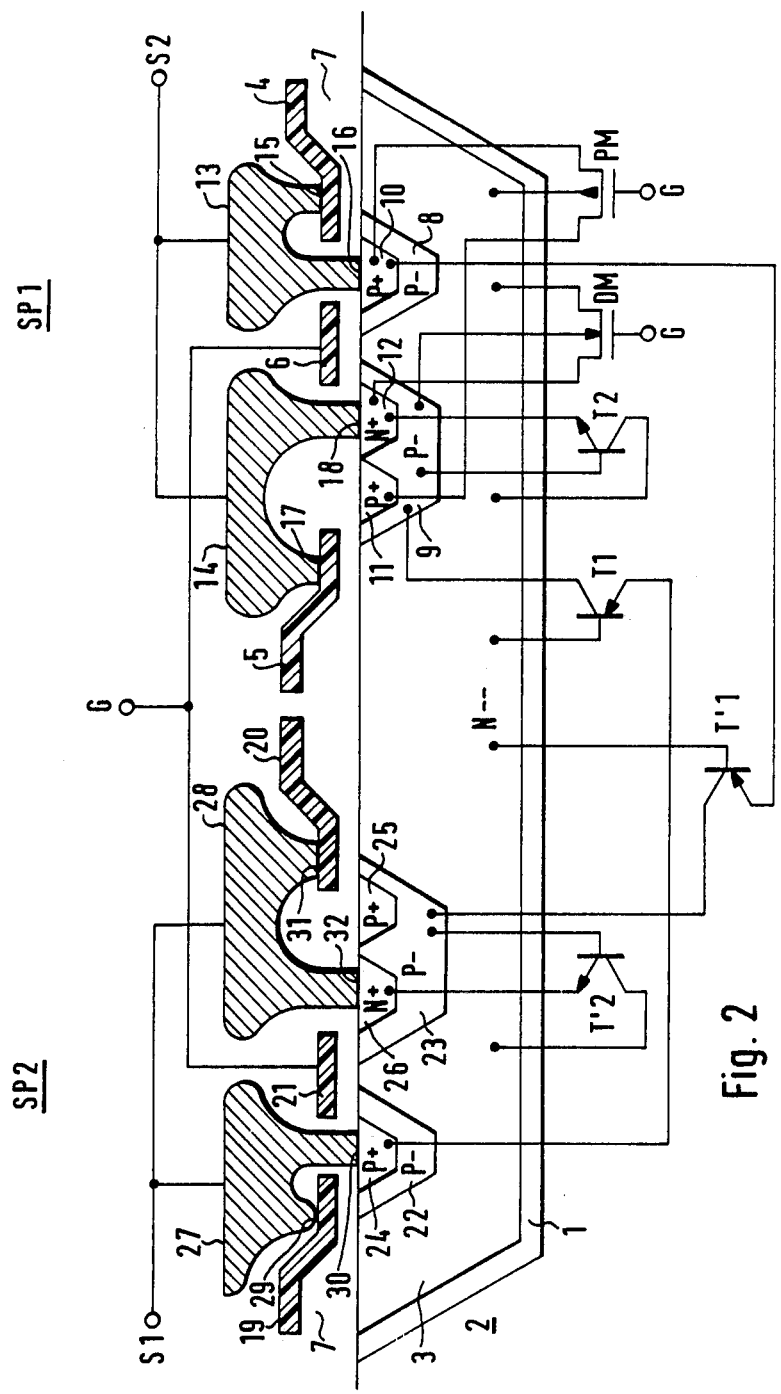
FIG. 2 is a cross-sectional view of an embodiment of such a device.

The semiconductor switching device may be integrated and a cross-section of an embodiment of such an integrated switching device is represented in FIG. 2. It includes a tub 1 which is made of an insulating layer of silicon oxide embedded in a polysilicon layer 2 and surrounding a substrate 3 made of a very slightly doped N material, indicated by N——. In the tub 1 and in the upper surface of the substrate 3 thereof switch parts SP1 and SP2 are realized. These switch parts are each other's mirror image with respect to the centre of the tub 1. However, they do not correspond to the above mentioned switches SW1 and SW2 as each of them contains portions of each of these switches, as will become clear later.

Switch part SP1 is briefly made as follows, all its parts being constituted by longitudinal elements.

First the field plates 4 and 5 and the gate plate 6 which are all made of polysilicon material are realized on a silicon oxide layer 7 provided on the upper surface of the tub 1. Wells 8 and 9 containing slightly doped P material, indicated by P—, are for instance made by ion implantation followed by a drive-in operation. Regions 10, 11 and 12 are realized in an analogous way. Regions 10 and 11 are constituted by a highly doped P material, indicated by P+, and region 12 is constituted by a highly doped N material, indicated by N+. Region 10 is formed in well 8 and both regions 11 and 12 are made in well 9. Aluminum conductive strips 13 and 14 are realized in such a way that strip 13 makes contact with field plate 4 and region 10 along surfaces 15 and 16 respectively, and that conductive strip 14 makes contact with field plate 5 and region 12 along surfaces 17 and 18 respectively. To be noted that the silicon oxide layer 7 is also introduced between the elements 4, 5, 6, 13 and 14 and also covers them. Finally, the strips 13 and 14 are electrically connected to terminal S2 and gate plate 6 is electrically connected to gate terminal G.

Switch part SP2 is similar to SP1 and includes the elements 19 to 21 and 22 to 32 which correspond to the elements 4 to 6 and 8 to 18 of SP1 respectively. Layer 7 is also used in SP2.

The above mentioned transistors T1, T2, DM, PM of SP1 and T'1, T'2 of SP2 are schematically represented in FIG. 2. The transistor DM' and PM' are not shown because they are identical to the first mentioned ones and the transistors T and T' are not represented because particularly, the electrodes of the transistors T1, T2, DM, PM and T'1, T'2 are as follows:

the base, emitter and collector of T1 are constituted by the N— — material of substrate 2, the P— and P+ mateial of well 22 and region 24 and the P— material of well 9 respectively;

the base, emitter and collector of T2 are constituted by the P— material of well 9, the N+ material of region 12 and the N— — material of substrate 2;

the gate, source and drain of DM which is formed at the upper surface of the tub 1 are constituted by the gate G or 6, the N+ material of region 12 and the N— — material of substrate 2 respectively. The channel is constituted by the P— material of well 9;

the gate, source and drain of PM which is also formed at the upper surface of the tub 1 are constituted by the gate G, the P— and P+ material of well 3 and region 11 and the P+ material of region 10 respectively. The channel is constituted by the N— — material;

the base, emitter and collector of T'1 are constituted by the N— — material of substrate 2, the P+ material of region 10 and the P— material of well 23 respectively;

the base, emitter and collector of T'2 are constituted by the P— material of well 23, the N+ material of region 26 and the N— — material of substrate 2 respectively.

In this known embodiment, when for instance transistor PM is made conductive current is drawn from the base of T2 and the collector of T1 to terminal S2 via the source, channel and drain of PM. More particularly, this current flows from the P— material of well 9 to the P+ material of region 10 and as follows from FIG. 2 the largest resistance encountered in this P— material is when this current issues from below the N+ zone 12. Indeed, such a current flows from below this N+ zone 12 to the P+ region 10, on the one hand via the P— material 9 and the channel of PM located under gate 6, and on the other hand via the P+ region 11 at the surface of tub 1, a P+ region (not shown) adjacent the channel of PM and this channel. Due to the presence of P+ material 9 the resistance of the source of the PMOS transistor PM is considerably lowered so that the effect of this transistor is considerably enhanced, i.e. this transistor may turn off a larger current. A drawback of this embodiment of the switching device of FIG. 2 is that it has a longitudinal surface, such a surface being not so well adapted to realize an optimum surface filling when combined with a plurality of such switching circuits and with substantially square control circuits and also bearing in mind that the switching circuits have to be connected to chip terminals located along the chip length.

For this reason a preferred second embodiment has been designed which occupies a substantially square surface and has a still smaller PM source resistance to permit turning off larger currents. It also has many other characteristic features. This second embodiment is described hereinafter by making reference to FIGS. 3 to 8.

FIGS. 3 and 4, with FIG. 4 on top, show two identical switch parts SP1 and SP2 which are so disposed that they penetrate into each other and cover a substantially square surface. Switch part SP1 is connected to supply terminal S2 via a relatively large aluminium conductive strip 33 (FIG. 4), and switch part SP2 is likewise connected to supply terminal S1 through a relatively large aluminium conductive strip 34 (FIG. 3). These switch parts SP1 and SP2 are also connected to the gate terminal G or 6 via the aluminum conductive strips 35 (FIG. 4) and 36 (FIG. 3) respectively.

Because both switch parts SP1 and SP2 are identical, only switch part SP1 is considered in detail hereinafter.

Hereby it should be noted that in FIGS. 3 to 5 conductive strips are represented by hachured parts, that FIG. 6 is a cross-section along line VI—VI through the center of an area D of a number of adjacent areas A to L forming part of the left hand lower portion of SP1 shown in FIG. 5, that FIG. 7 is a cross-section of area D along line VII—VII parallel to line VI—VI, and that FIG. 8 is a cross-section along line VIII—VIII through the centre of area A. The latter area is identical to area B and each of these two areas comprises three successive zones having cross-sections equal to those of FIG. 7, FIG. 8 and again FIG. 7 respectively. Likewise, each of the areas C to L which are also identical comprises three successive zones having cross-sections equal to those of FIG. 7, FIG. 6 and FIG. 7 respectively.

Switch part SP1 is realized by a process similar to the one briefly described above in connection with FIG. 2. As will become clear later, the upper face of tub 1 is constituted by P+ material 10, 11 and N+ material 12, 46, except for the area under gate 6 and also for the area near the edges of SP1 where P+ material is separated from the N— — material by P— material having a higher radius of curvature to prevent breakdown.

As shown in FIGS. 3 and 4, switch part SP1 covers an area delimited by an S-shaped side having curved ends, the lower one of which is joined by a further curved portion 37 to one of two rectilinear sides which are disposed at a right angle. The other rectilinear side is separated from the upper curved end of the S-shaped side by a gap allowing the passage of the above mentioned conductive strip 35.

Gate 6 is constituted by a serpentine-shaped string having a lower portion 38 extending along the loer side of switch part SP1 and a portion 39 covering the central surface of SP1 and comprising several undulated fingers. At its upper right hand part gate 6 has a terminal 40 to which the conductive strip 35 is connected in 41. As will become clear later, the serpentine-shaped gate is located above a serpentine-shaped channel of N— — material separating an area of P+ material 10 from an area of P+ material 11. The area of P+ material situated near the upper curve of SP1 is relatively large because at this location gate 6 makes a large curve parallel to this upper curve.

A conductive strip 63 is connected to the upper surface of gate 6 in order to short-circuit the left and right hand (FIG. 8) parts thereof. These parts have been respectively doped with P and N material during the process for making the switch and the gate 6 would thus constitute a diode if no precautions were taken.

P− region 8 and P+ region 10 both extend along the rectilinear sides of SP1. They have cross-sections equal to those shown in FIGS. 6 to 8 from which it follows that at the outer edge of both these sides the P+ material of region 10 is separated from the N− − substrate material by the P− material of well 8. At the inner edge of these rectilinear sides the P+ material of region 10 extends partly under gate G and beyond the P− material. More particularly, at the lower rectilinear side of SP1 the P+ material 10 protrudes betweeen and partly under the serpentine portion 38 of gate 6, whilst at the right-hand rectilinear side of SP1 the P+ material 10 protrudes between fingers of the undulated portion 39 of this gate.

As also represented in FIGS. 3 to 8 a conductive strip 13, which is connected to conductive strip 33 leading to supply terminal S2, and a field plate 4 are arranged along the rectilinear sides of SP1 and this strip 13 is connected to this field plate 4 at the locations 15 and makes contact with the P+ material of region 10 at the locations 16. The rectilinear right hand part of conductive strip 13 moreover has a plurality of strip-shaped fingers such as 42 and 43 which make contact with the underlying P+ material 10 at a plurality of places such as those indicated by 44 and 45 in FIGS. 3, 4. The elements 42 and 44 are also represented in FIG. 5.

P− well 9 is S-shaped and forms the S-shaped side of SP1. It contains a P+ region 11, a plurality of square N+ regions 46 which are also disposed along an S-shaped string, and two rectangular N+ regions 12 located near the above mentioned curve 37 at the left hand end of SP1. These wells and regions 9, 11, 12 and 46 are shown in the left hand side of the above FIGS. 6 to 8 from which it follows that in the area A-L of SP1 the N+ regions 46 are completely surrounds by the P+ material of region 11 and that the rectangular N+ regions 12 are surrounded by the P+ material of region 11 at three sides and by P− material of well 9 at the side adjacent gate 6. At the outer edge of this S-shaped side of SP1 the P+ material of region 11 is separated from the N− − substrate material by the P− material of well 9. At the inner edge of this S-shaped side of SP1 the P+ material of region 11 partly extends under gate G and beyond the P− material (FIGS. 6, 7) or the N+ material of region 12 and the adjacent P− material of well 9 both partly protrude under gate (FIG. 8).

Due to the fact that the P+ material of the regions 10 and 11 under gate 6 (FIG. 7) has a small depth the location of their outer edges can be accurately determined and the same is true for the edges of gate 6 above these edges. Moreover, the P+ material of region 11 between the N+ material and the P-material of well 9 at the side of field plate 5 (FIG. 8) acts as a stopper diffusion preventing leakage between this N+ material and the N− − material.

As also represented in FIGS. 3 to 8 an S-shaped conductive strip 14 and a field plate 5 are arranged along the S-shaped side of SP1 and this strip is connected to conductive strip 13 in the above mentioned curve 37. Strip 14 is also connected to field plate 5 at the location 17 and with the N+ material of the regions 12 and 46 at the locations 18. Strip 14 is moreover connected via a large bridge piece 47 to an enlarged head 48 of a strip-shaped finger 49, this enlarged head 48 making itself contact with the above mentioned large area of the underlying P+ material 10 in a plurality of locations such as 50. Finally, conductive strip 14 is also connected to a strip-shaped finger 51 which also makes contact with this P+ material 10 in a plurality of locations such as 52.

To be noted that at each of the locations such as 44 (FIG. 4) and 52 where a strip-shaped finger such as 42 and 51 makes contact with the underlying P+ material, the gate 6 is at an incrased distance from this connection sufficient to prevent breakdown.

A further conductive S-shaped strip 53/54 extends in parallel with the S-shaped conductive strip 14 and comprises two parts 53 and 54 which are interrupted by the above mentioned conductive bridge piece 47. The strip 53/54 makes contact with the P+ material of region 11 in a plurality of locations idicated by 55 (FIGS. 3 to 8). More particularly, part 53 of strip 53/54 is connected to a plurality of strip-shaped fingers such as 56 and 57 which make contact with the underlying P+ material 11 at one side of gate 6 in a plurality of locations such as 58 and 59. Part 54 is likewise connected to a strip-shaped finger 60 which itself makes contact with the underlying P+ material 11 in a plurality of locations such as 61. In order that this finger 60 should be at the same potential as those connected to part 53 a conductive bridge piece 62 interconnects fingers 60 and 59.

The cross-sections of the remaining part of the S-shaped portion of SP1 are similar to those shown in the left hand part of FIGS. 6 and 7 except that in several of these cross-sections neither the P+ material nor the N+ material is contacted.

From the above and from the comparison of FIGS. 2 and 6 to 8 it follows that a DMOS transistor DM, especially visible in FIG. 8, has been formed in each of the areas A and B of SP1, both these transistors being connected in parallel. Also a plurality of transistors T1 (emitter, source), T2, PM and T'1 (base, emitter) have been realized, homologous transistors being connected in parallel. Transistors T1, T2, DM, T'1 and PM are shown in FIG. 8 and FIG. 7 respectively. More particularly, the collector of T1 and the base of T2 are constituted by the P− material of well 9, whereas the source of PM is constituted by the P+ material of region 11. This was also the case in FIG. 2.

When for instance, transistor PM is made conductive current is drawn from the base of T2 and the collector of T1 to terminal S2 via the source, channel and drain of PM. This current flows from the P− material of well 9 to the P+ material of region 10 and the largest resistance encountered in this P− material is when this current issues from below a square 46 of N+ material. Indeed, such a current flows from below this N+ zone 46 to the P+ region 10 via P+ material 11 at all sides of the square 46 and the N− − channel of PM. Due to the presence of the P+ material at all sides of the N+ material the resistance of the source of the PMOS transistor PM is considerably lower than that in the embodiment of FIG. 2 so that the effect of this transistor is further enhanced. This means that PM can turn off larger currents.

It should be noted that the embodiment of FIG. 2 could be modified in such a manner that also therein the N+ material of regions 12 and 26 is completely surrounded by P+ material.

From the above FIGS. 6 to 8 it follows that the P+ material 10 forms the emitter of transistor T'1 whose collector is constituted, as shown in FIG. 2, by the P− material 23 which also forms the base of transistor T'2 whose emitter is constituted by the N+ material 26.

Hence, current is able to flow from the emitter of T'1 to the emitter of T'2 i.e. from P+ material 10 to N+ material 26. Because the surface of the curved string of N+ material of region 26 in the upper part of SP2 is relatively large a large current is able to flow therein and therefore it was necessary to arrange in front of this curved string a large area of P+ material 10 contacted by an equally large contact surface 50.

Obviously the same reasoning is also true for the transistors T1 and T2 and for this reason SP2 has a contact surface corresponding to contact surface 50 of SP1.

In the above it has been mentioned that the lower the source resistance of the PMOS transistor, the higher is the current able to be interrupted by this transistor. It has indeed been found that when calling RE the combination of the resistance of the collector of T1, of the base of T2 and of the source-to-drain path of PM, then the maxium interruptable current is given by $$I = \frac{0.5\,(b1 + 1)}{RE\,(b1 - 1/b2)}$$

wherein b1 and b2 are the current amplification factors at the value I of transistor T1 and T2 respectively. When plotting RE in function of I it appears that with increasing values of I, RE first decreases rapidly and afterwards more slowly.

As described above, a main feature of the present switch is that the emitter of T2 is constituted by a plurality of squares 46 of N+ material completely surrounded by P+ material. The structure of each of the switch parts SP1 and SP2 is based on this feature and on the following insight:

because the emitter of T2 forming part of SP1 is constituted by a plurality of small squares 46 of N+ material and this emitter should have a sufficient surface for given dimensions of the switch, these squares 46 should be arranged along an undulated string having a relatively great length with respect to these dimensions;

the same reasoning is true for SP2 since both switch parts should be identical;

for breakdown reasons the radius of the undulations of these strings should not be too samll;

in order that SP1 and SP2 should cover a substantially rectangular or square surface without substantially free space between them, these undulated strings should penetrate into each other;

each of the switch parts should have a gate with a sufficiently great maximum width with respect to the switch part dimensions;

to prevent voltage breakdown, in the switch parts SP1 and SP2 the P+ material connected to terminal S1 (S2) at one side of a gate should be at a sufficient distance from the N+ material connected to terminal S2 (S1) at the other side of this gate and this distance should be preferably be constant. The same is true for all the wells, regions and zones belonging to different switch parts.

For all these reasons the present switch structure comprises two identical switch parts SP1 and SP2 wherein the squares of N+ material are arranged along S-shaped strings which are parallel to each other and penetrate into each other in such a way that they cover a substantially square surface and provide sufficient space to arrange relatively long serpentine-shaped gates. Also the strings of N+ material of SP1 (SP2) are at a substantially constant distance of the P+ material of SP2 (SP1).

It should also be noted that the field plates 4 and 5 reduce the risk of voltage breakdown since they reduce the maximum electric field at the switch edges.

Finally the following should be noted with respect to the choice of DM and DM'.

As already mentioned above, DM and DM' are identical and the drain-to-source path of DM' shunts the emitter-to-base path of PNP transistor T1 and is connected in series with the drain-to-source path of DM. Consequently, the voltage across the drain-to-source path of DM' has to reach 0.7 Volts before PNP transistor T1 can become operative. This means that when DM' and hence also DM is relatively too large and therefore presents a relatively small impedance, a relatively high current has to flow through it to reach this 0.7 Volts voltage drop. In this case the switch operates substantially as represented in FIG. 9 by the I/V characteristic 65. From this characteristic it follows that the turn-on of the thyristor is accelerated, but also that in the lower current levels the switch essentially operates as a DMOS and not as a thyristor. On the contrary, when DM' (and hence also DM) is relatively too small and therefore presents a relatively high impedance, a relatively small current has to flow through it to reach the above mentioned 0.7 Volts voltage drop. In this case the switch opeates substantially as represented in FIG. 9 by the I/V characteristic 64. From this characteristic it follows that the turnover from DMOS mode to thyristor mode is very abrupt.

It has now been found that to ensure a smooth transition from DMOS mode to thyristor (characteristic 66) mode the voltage over the switch should be as close as possible to the base-emitter saturation voltage VBE of transistor T1 or T'1, this voltage V being given by $$V = (Rb + Rd) \cdot \left( \frac{VBE}{Rd} + ib \right) + VBE$$

wherein:
ib is the minimum base current needed to turn on the thyristor;
Rb is the combined bulk resistance of the N—material in the base of T1 or T'1 and in the collector of T2 or T'2;
Rd is the channel resistance of DM or DM'.

From this relation it follows that V is minimum when $$Rd = \frac{VBE \cdot Rb}{ib}$$

but determining the size of DM and Dm' from this formula is not always simple because of the difficulties in determining ib.

In a preferred embodiment the surface occupied by each of the DMOS transistors is equal to 0.35 mm2.

In the following description of FIGS. 10 to 23 reference is made to a line circuit of a telephone exchange which is connected to a protection unit, associated to a telephone line, via two pairs of bidirectional electronic switches. The switches of each pair are connected in series and separated by a resistor. The one and other sides of these resistors are respectively connected to a ringing circuit and to a test circuit via two other pairs of bidirectional electronic switches. The switches close to the protection unit have associated protection circuits, whereas the others have not.

The electrical circuit of a protected bidirectional switch is shown in FIG. 10. It includes two identical protected unidirectional switches SW1 and SW2 connected in anti-parallel between supply conductors S1 and S2 and having a common control terminal or gate G. A protection circuit PC1, PC2 (not shown) is associated to each of these switches. Unidirectional switch SW1 includes a thyristor comprising PNP transistor T1 and NPN transistors T2 and T3, a DMOS transistor DM, PMOS transistors PM1 and PM2 and resistors R1 to R3. The emitter of transistor T1 is fed from supply conductor S1 and its two collectors are connected to the bases of the respective transistors T2 and T3 whose collectors are joined to the base of transistor T1. The emitters of transistors T2 and T3 are connected to supply conductor S2 via the resistors R1 and R2 respectively. The bases of transistors T1, T2 and T3 are connected to supply conductor S2 through the drain-to-source path of transistor DM and current limiting resistor R3 in series, the source-to-drain path of transistor PM1 and the source-to-drain path of transistor PM2 respectively. The gates of PM1, PM2 and DM are connected to the common control terminal G and the emitter of transistor T2 is connected to protection circuit PC1. The base and emitter of transistor T3 and the gate of transistor DM are connected to the protection circuit PC2. To be noted that resistors R1 and R2 form part of PC1 and PC2 respectively. The switch may be triggered to its conductive condition by transistor DM and be turned off by means of transistors PM1 and PM2. When for instance supply terminal S1 is at a sufficiently high voltage with respect to supply terminal S2 and control terminal G is activated, then transistor DM becomes conductive followed by T1 and T2, T3 which sustain each other's operation. To turn off the switch a suitable negative voltage has to be applied to the control terminal G of the transistors PM1 and PM2. Indeed, when the latter become conductive they draw current from the bases of T2 and T3 which are thus brought in the non-conductive condition followed by transistor T1.

Unidirectional switch SW2 includes transistors and resistors (all not shown) similar to the corresponding components of switch SW1 and operates in a similar way as SW1. However, this happens when supply terminal S2 is at a higher voltage than supply terminal S1.

The electrical circuit of an unprotected bidirectional switch differs from the protected one shown in FIG. 10 by the absence of transistors T3 and PM2, of the resistors R1 to R3 and to the protection circuits PC1 and PC2.

The protected bidirectional switch shown in FIG. 10 has been integrated on a rectangular surface wherein the constituent unidirectional switches SW1 and SW2 are symmetrically disposed with respect to a point of this rectangle. Reference is now made to FIG. 11 which shows the lay-out of the obtained semiconductor switch SW1 and of a small part of SW2, the above point of symmetry being indicated by A.

Switch SW1 includes the thyristor T1-T3, the DMOS transistor DM, the PMOS transistors PM1 and PM2 and the protection circuit PC1, PC2 of which also transistors T4 and T5 form part. This switch SW1 is fed from the horizontal conductive supply conductors S1 and S2 to which the thyristor T1-T3 is connected via conductive strips 72 and 73. All these strips S1, S2, 72, 73 have a relatively small resistance because they are relatively wide, e.g. 80 micron. Moreover, the strips 72 and 73 are relatively short since they are to a large extent perpendicular to the conductors S1, S2. Also the other connecting strips between the various devices of the switch are as wide as possible to minimize their resistance. The thyristor T1-T3 with the associated transistor DM and the PMOS transistors PM1 and PM2 are integrated in three different tubs in order that they may be given optimum dimensions. Also various parts of the protection circuit PC1, PC2 are integrated in other tubs.

The arrangement including thyristor T1-T3 and associated DM will now be considered in more detail by making reference to FIG. 12 which shows part XII of FIG. 11 in more detail and with some of the metal strips broken away to give a better view of the underlying lay-out, to FIGS. 13 and 14 which are (distorted) cross-sections along lines XIII—XIII and XIV—XIV of FIG. 12 respectively, as well as to FIGS. 15 to 21 representing various (distorted) masks used to realize the lay-out shown in FIG. 12.

The thyristor arrangement T1-T3, DM is integrated in a tub 74 (FIG. 13) made of an insulating layer of silicon oxide embedded in a polysilicon layer 75 and surrounding a substrate 76 made of a very slightly doped N material, indicated by N—. The arrangement includes an elongated part 77 (FIG. 12) connected to the above mentioned strip 72 (leading to supply conductor S1) and located at a constant distance from a boat-shaped part 78 comprising two halves which are connected via respective conductive strips 73' and 73" and via respective resistances R1 and R2 (FIG. 11) to the above mentioned conductive strip 73 leading to supply conductor S2. These two halves are further connected to the protection circuits PC1 and PC2 via the respective conductive strips 79 and 80. A further conductive strip 81 connects the gate of the DMOS transistor DM to PC2 to which also strip 73" is connected (not shown).

Figure 16:
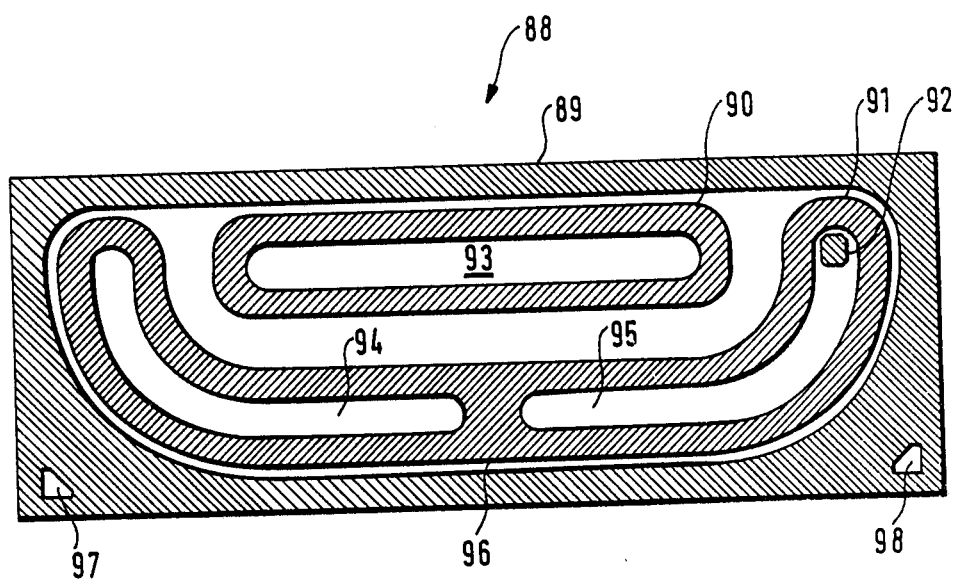

The integrated arrangement T1-T3, DM is obtained in the way described hereafter. After a layer of uniform thickness of a gate oxide has been applied to the upper surface of the N— material in the tub 74, use is made of the mask 82 of FIG. 15. This mask defines a substantially rectangular surface 83, a boat-shaped surface 84 disposed at a constant distance of surface 83, and two triangular parts 85 and 86. The boat-shaped surface 84 has a straight portion and two quarter-circle ends surrounding the shorter sides of the rectangular surface 83. The gate oxide located below the surfaces 83 and 84 is removed, whereas the remaining gate oxide is grown so that a layer 87 (FIG. 13) partially covering the upper surface of tub 74 is obtained. Use is then made of the mask 88 in FIG. 16 to apply a layer of polysilicon material on predetermined portions of the tub upper surface thus obtained. This mask 88 comprises parts 89 to 92 so that the following pattern of polysilicon material is realised, the portions of this pattern being given the same reference numerals as the mask portions:

a rim 90 surrounding a substantially rectangular surface 93 (FIGS. 13, 16);

a boat-shaped rim 91 (FIGS. 13, 14, 16) having a center portion 96 and surrounding a boat-shaped surface 94, 95 comprising two surfaces 94 and 95 separated by the portion 96. The boat-shaped surface 94, 95 surrounds the two shorter sides and one longer side of the surface 93 and its ends are substantially level with the other longer side of 93;

a peripheral part 89 (FIG. 16) surrounding both the rectangular and boat-shaped surfaces 93 and 94, 95 and having triangular openings 97 and 98. The part 89 is not shown in FIG. 13;

a substantially square gate surface (FIGS. 14, 16) located near the rim 91 in the right hand upper end of the boat-shaped surface 94, 95.

To be noted that the rims 90, 91 and 92 constitute field plates having the same function as the above field plates 4 and 5, whilst the peripheral surface 89 constitutes a shield plate used to prevent breakdown.

Figure 17:
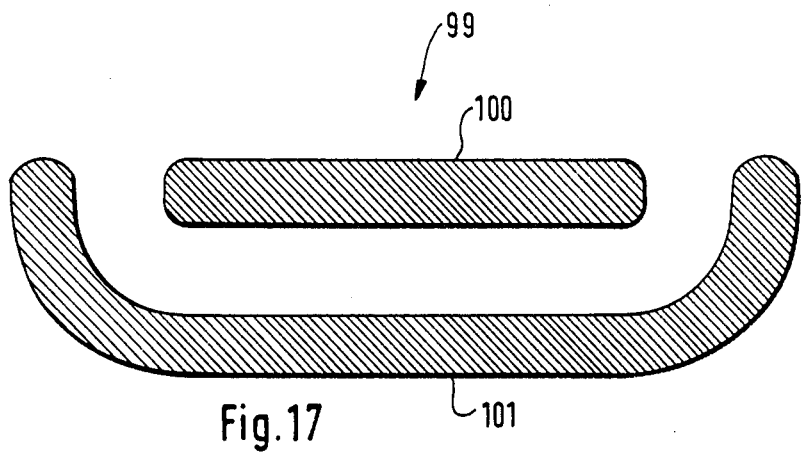

Use is then made of the mask 99 represented in FIG. 17 and defining a substantially rectangular surface 100 as well as a boat-shaped surface 101, to realize wells 102 and 103 (FIG. 13) of P— material in the rectangular and boat-shaped surfaces 93 and 94, 95 surrounded by the rims 90 and 91 respectively. These wells are for instance realised by ion implantation followed by a drive-in operation. Well 102 has a substantially rectangular shape, whilst well 103 has a boat shape with two subwells separated by the portion 96 of polysilicon material. To be noted that the well 103 is interrupted below the gate surface 92, as shown in FIG. 14.

Figure 18:
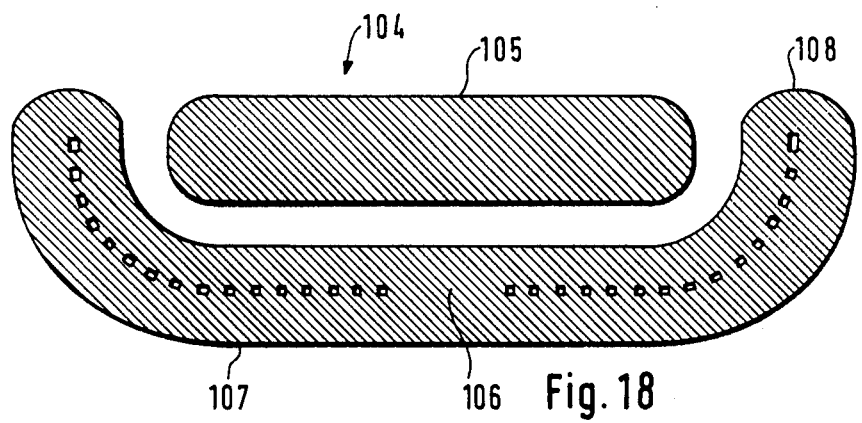

In a following step use is made of the mask 104 represented in FIG. 18 and defining a substantially rectangular surface 105 as well as a boat-shaped surface 106 with a boat-shaped path of apertures 107 and 108 located at a constant distance of 105. The apertures 107 are square, whilst aperture 108 is rectangular. The mask 104 is used to realise the substantially rectangular zone 109 and the boat-shaped zone 110 (FIGS. 13, 14) of P+ material, in the wells 102 and 103. This is for instance done in the same way as for these wells. To be noted that zone 110 partially extends below the above gate surface 92 (FIG. 14) and that it comprises two subzones defined by the above mentioned surfaces 94 and 95.

Figure 19:
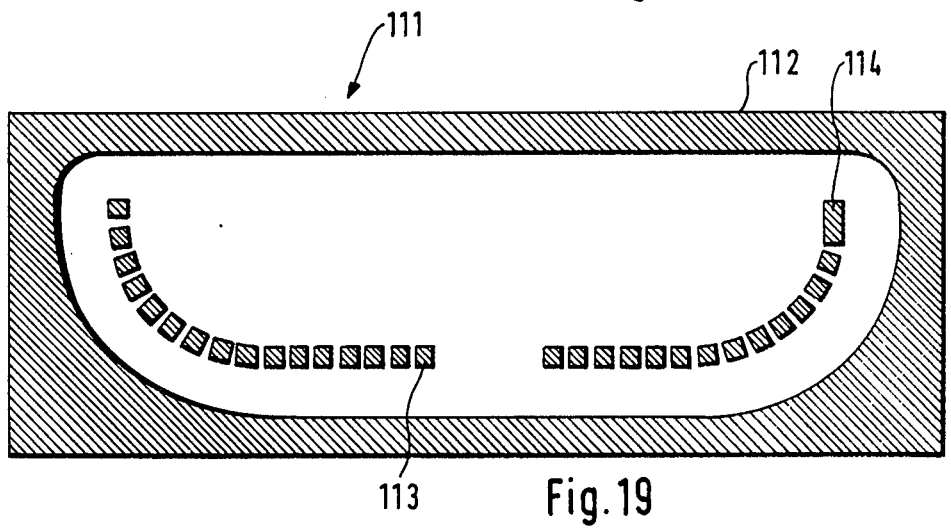

After the zones 109, 110 have been realized, the mask 111 shown in FIG. 19 and defining a peripheral surface 112, a path of identical square surfaces 113 and a rectangular surface 114 is used to realize the following regions of N+ material, e.g. in the same way as for the above wells and zones. To be noted that the surfaces 113 and 114 are equal to the apertures 107 and 108 (FIG. 18) respectively, although this does not appear from the drawing:

a path of square regions 115 (FIGS. 13, 14) which are each completely surrounded by P+ material of the zone 110;

a rectangular region 116 (FIG. 15) near the right hand upper end of the boat-shaped surface. This region is also surrounded by P+ material of zone 110 except at one side where it extends below the gate surface 92 (FIG. 14);

a peripheral region (not represented in FIGS. 13, 14) covering the peripheral surface 89 (FIG. 16) of polysilicon material.

Figure 20:
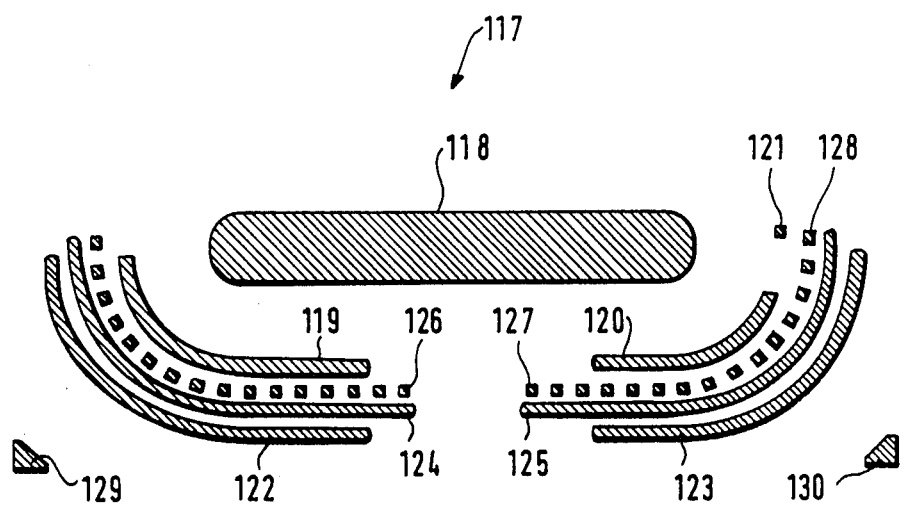

The mask 117 of FIG. 20 defining parts 118 to 130 is then used to realize a pattern of contact material on the upper surface of the tub 74. This pattern comprises the following like named surfaces:

a substantially rectangular contact surface 118 (FIG. 14) on the upper surface of zone 109;

a number of interrupted surfaces defining left and right halves of a boat-shaped structure and including:

contact strips 119 (FIG. 13), 120 and 121 (FIG. 12) on the upper surfaces of the field plate 91 of polysilicon material;

contact strips 122 (FIGG. 13) and 123 on the same field plate 91;

contact strips 124 (FIG. 13) and 125 on the upper surfaces of respective subzones of zone 110;

square contact surfaces 126 (FIG. 13) and 127 (FIG. 14) on the upper surfaces of the regions 115;

a contact surface 128 (FIG. 14) on the upper surface of gate surface 92;

contact surfaces 129 and 130 making contact with the N— material via N+ material.

Figure 21:
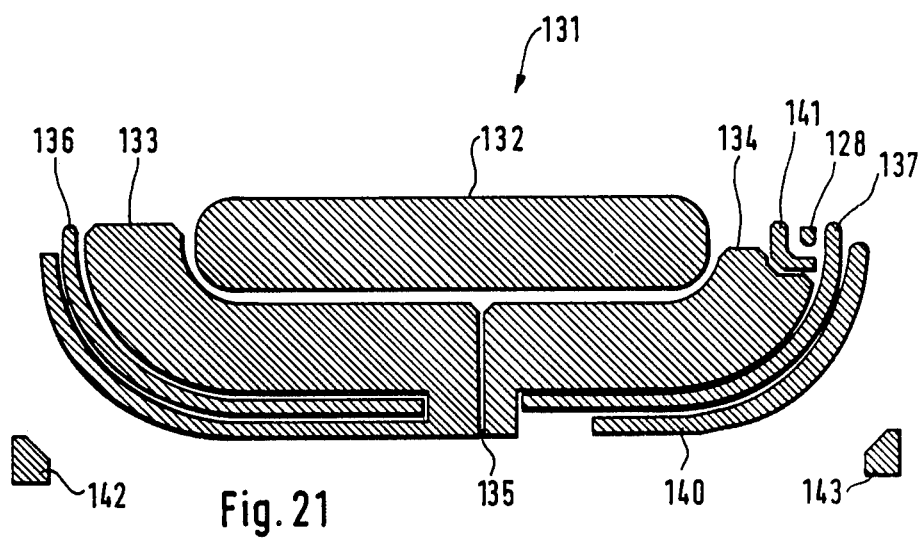

Finally, by means of the mask 131 represented in FIG. 21 a metal layer is applied to the upper surface of tub 74 according to the following pattern whose portions carry the same reference numerals as those of the mask 131:

a substantially rectangular conductive plate 132 (FIGS. 12, 13) having the above mentioned contact surface 118 (both generally indicatd by 77 in FIG. 12) and connected to strip 72 leading to supply conductor 51;

a boat-shaped conductive part (generally indicated by 78 in FIG. 12) comprising two plates 133 and 134 separated in 135 and having the above mentioned contact surfaces 119, 126, 122 (FIG. 13) and 120, 127 respectively. These plates are connected to the above mentioned strips 73' and 73", leading to supply strip S2 via resistors R1 and R2 (FIG. 10) respectively, and also to the above mentioned strips 79 and 80 (FIG. 13) leading to the protection circuits PC1 and PC2 respectively;

a boat-shaped interrupted strip 136, 137 having the above mentioned contact surfaces 124 and 125 respectively. These contact strips 136, 137 are also connected to the PMOS transistors PM1 and PM2 via the conductive strips 138 (FIGS. 12, 13) and 139 (FIG. 12) respectively;

a conductive curved strip 140 having the above mentioned contact surface 123;

a conductive L-shaped strip 141 (FIG. 12) which connects the above mentioned contact surface 121 with the square contact surface 127 adjacent the contact surface 128. Because the strip 141 thus makes contact with the underlying polysilicon material with which also plate 134 makes contact along surface 120 a resistance is formed between these contact surfaces 120 and 121. This resistance is indicated by R3 on FIGS. 10 and 14;

the above mentioned conductive strip 81 leading to PC2 and having contact surface 128 (FIGS. 12 and 14);

conductive parts 142 and 143 having the above mentioned contact surfaces 129 and 131 respectively. Thus the shield plate 89 is brought at the same potential as the N— material.

To be noted that strips 144 and 145 shown on FIG. 12 do not form part of the invention.

From the cross-section, shown in FIG. 13, of the left hand part of the device represented in FIG. 12 it follows that it comprises the bipolar transistors T1 and T2 whose electrodes are schematically indicated in FIG. 13 and which are also shown in FIG. 10. The right hand part of this device likewise includes the bipolar transistors T1 and T3. More particularly, from FIG. 13 it follows that the emitters of T1 and T2 are constituted by the P+ material of zone 109 and by the N+ material of the regions 115 of a subpath of the path of regions respectively, that the base of T1 and the collector of T2 are constituted by the N— material and that the base of T2 and the collector of T1 are constituted by the P+ material of a subzone of zone 110.

From the cross-section, shown in FIG. 14, of the device of FIG. 12 it follows that the right hand part of this device also includes the DMOS transistor DM whose electrodes are also indicated in FIG. 14 and which is also represented in FIG. 10. More particularly, the source, drain and channel of DM are constituted by the N+ region 116, the N— material and the P— material between this region and this material respectively. The gate of DM is gate 92.

As mentioned above, the contact strips 137 and 138 are connected to the PMOS transistors PM1 and PM2 integrated in different tubs respectively. Because these transistors are similar only PM1 is considered further. Reference is hereby made to FIG. 11 and to FIG. 22 showing a cross-section along line XXII—XXII of FIG. 11 i.e. across an electrically isolated tub 144 (FIG. 22) different from the above mentioned tub 74. In the N— substrate of this tub 144 are made two zones such as 145 and 146 of P+ material, separated by a string of N— material, and a plurality of regions such as 147 of N+ material. The above mentioned conductive strip 138 makes contact (FIG. 23) with adjacent zones 147 and 145 of N+ and P+ material and has a plurality of oblique fingers such as 148 making contact with the other zones 145. The conductive strip 73 has a plurality of oblique fingers such as 149 which interleave with the fingers 148 and make contact with the zones 146. These sets of fingers 148 and 149 are separated by a string-shaped gate 150 of polysilicon material (FIG. 23) located above the string of N— material. The zones 145 and 146 of P+ material, the N— material and the gate 150 constitute the source, drain, channel and gate of the PMOS transistor PM1. The source and channel are interconnected via the N+ material of region 147 and the strip 138.

In connection with the above it should be noted that PM1 is larger than PM2 because it has to switch-off a larger current, the current through T2 being larger than that through T3 because R1 is chosen smaller than R2.

From the above description of an arrangement comprising two unidirectional switches provided with protection circuitry, and more particularly from FIG. 11, it follows that the thyristor arrangements T1-3, DM and T'1-T'3, DM' are symmetrically disposed with respect to point A with the open sides of the boat-shaped emitters of T2, T3 and T'2, T'3 being directed away from each other.

A similar symmetry exists in an arrangement comprising two unidirectional switches without protection circuitry. This becomes clear from FIG. 23 which shows these two switches each comprising a respective thyristor T1, T2 and T'1, T'2, a respective DMOS transistor DM and DM' and a respective PMOS transistor PM1 and PM'1. The thyristor arrangements T1, T2, DM and T'1, T'2, DM' have the same shape as the above thyristor arrangement T1-T3, DM and are symmetrically disposed with respect to point B. However, the open sides of the boat-shaped emitters of T2 and T'2 are now directed towards each other. The rectangular emitters of T1 and T'1 are disposed in parallel and so that they face each other but are slightly shifted. In this way the latter emitters can be easily connected via relatively short and wide conductive strips with the one ends of the emitters of T'2 and T1 respectively. Moreover, the one or other ends of the latter emitters are located close to the supply terminals S1 and S2 so that they can also be connected therewith via short and wide conductive strips. More particularly:

the emitter of T1 is connected via the short conductive strip 151 to the adjacent one end of the conductive plate 152 uniting the emitter surfaces of T'2, the other end of latter plate being connected to the adjacent supply terminal S1 through conductive strip 153;

likewise the emitter of T'1 is connected via the short conductive strip 154 to the adjacent one end of the conductive plate 155 uniting the emitter surfaces of T2, the same end being also connected to the adjacent supply terminal S2 via conductive strip 156.

In the above described bidirectional switches T1, T2 (or T1-R3) and T'1, T'2 (or T'1-T'3) the emitters of T2 have the shape of a boat surrounding the substantially rectangular emitter of T1. Instead of using such boat-shaped emitters, it would be possible to give each of the emitters of T2 and T'2 the shape of an oval and to arrange both these ovals in such a way that they face each other. Both these ovals have to be interrupted for the passage of conductive strips interconnecting the emitters of T1 and T'2 and of T'1 and T2 respectively. In order that these strips should have a reduced resistance they should be relatively wide and short. However, when making them wider the effective length of the emitters of T2 and T'2 correspondingly decreases. On the other hand, the minimum length of these interconnecting strips is obtained when the ovals are facing each other, in which case this length is substantially equal to two times half the width of an oval plus a predetermined short distance. On the contrary, in the arrangement described above the width of the interconnecting conductive strips such as 151 and 154 (FIG. 23) does not effect the effective length of the emitters of T2 and T'2 and these conductive strips can be short since the emitters of T1 and T'2 and of T'1 and T2 face each other and may be disposed at the above predetermined short distance from each other.

While the principles of the invention have been described above in connection with specific apparatus, it is to be clearly understood that this description is made only by way of example and not as a limitation on the scope of the invention.

We claim:

1. Semiconductor thyristor device comprising a first transistor and at least one second transistor whose base-to-emitter junction is shunted by a controllable multi-electrode turn-off device and whose emitter comprises a region of a highly doped material of a first conductivity type embedded in a well of a material of a second conductivity type, the collector of said first transistor and the base of said second transistor being constituted by said well, and an input electrode of said turn-off device being constituted by a zone of a highly doped material of said second conductivity type which makes direct surface contact with said region along substantially the whole circumference thereof so as to facilitate the deviation of current from below said region into said zone upon said turn-off device being operated.

2. Semiconductor device according to claim 1, characterized in that said zone completely encircles and is adjacent to said region.

3. Semiconductor device according to claim 2, characterized in that said second transistor has an emitter comprising a plurality of emitter elements each constituted by a different region of a highly doped material of a first conductivity type which is completely encircled by and is adjacent to said zone.

4. Semiconductor device according to claim 3, characterized in that said plurality of individual emitter elements are arranged in a wave-shaped string and are encircled by and adjacent to said zone.

5. Semiconductor device according to claim 1, characterized in that said well comprises slightly doped P (P−) material, said region comprises heavily doped N (N+) material and that said first transistor is a PNP transistor and said second transistor is an NPN transistor which are interconnected between two terminals constituting respective emitters of said transistors, and that the collector of said PNP transistor and the base of said NPN transistor are constituted by said well the emitter of said NPN transistor is constituted by said region and said zone constitutes an input electrode of said turn-off device.

6. Semiconductor device according to claim 31, characterized in that said zones have a lower depth than that of said well.

7. Semiconductor device according to claim 31, characterized in that part of said first mentioned zone defines an S-shaped surface, and part of said second zone define two perpendicular surfaces which terminate adjacent to the ends of said S-shaped surface, and that said first and second zones include other parts which extend into the surface enclosed by said perpendicular and S-shaped sides.

8. Semiconductor device according to claim 7, characterized in that it includes an S-shaped first conductive strip provided with a plurality of first strip-shaped fingers, said first strip and said first fingers making contact with said S-shaped surface and with said other part of said first zone which extends into said enclosed surface respectively, and that it further includes a second conductive strip provided with a plurality of second strip-shaped fingers said second strip and said second fingers making contact with said perpendicular surfaces and with a said other part of said second zone which extends into said enclosed surface respectively.

9. Semiconductor device according to claim 8, characterized in that said second conductive strip also makes contact with said region and constitutes one of said terminals, and that one of said second strip-shaped fingers in interrupted and has a first part with an enlarged head a curve of said S-shaped surface and is connected to said second conductive strip.

10. Semiconductor device according to claim 9, characterized in that said head is connected to said second conductive strip via a first conductive piece, said first conductive strip is divided so as to form two parts, and one of said first strip-shaped fingers is connected at least via a second conductive piece to one of said parts of said interrupted first conductive strip.

11. Semiconductor device according to claim 31, characterized in that $$I = \frac{0.5\,(b1 + 1)}{RE(b1 - 1/b2)}$$

wherein
I is the maximum current able to be interrupted by said PMOS transistor;

b1 and b2 are the current amplification factors of said PNP and NPN transistors at said current respectively; and RE is the combined resistance of the collector of said PNP transistor, of the base of said NPN transistor and of the source-to-drain path of said PMOS transistor 12. Semiconductor device according to claim 5, characterized in that it further includes a turn-on device constituted by a DMOS transistor shunting the collector-to-emitter path of said second transistor and having a source constituted by one of said emitter elements of N+ material, a channel constituted by said P− material and a drain constituted by said slightly doped material of N conductivity type.

13. Semiconductor device according to claim 12, characterized in that $$Rd = \left(\frac{VBE \cdot Rb}{ib}\right)^{\frac{1}{2}}$$

wherein
ib is the minimum base current needed to turn on the device;
Rd is the channel resistance of said DMOS transistor;
VBE is the base-emitter saturation voltage of said PNP transistor; and
Rb is the combined resistance of the base and collector of said PNP and NPN transistors respectively.

14. Semiconductor arrangement, characterized in that it includes two semiconductor devices according to claim 31, said devices being connected in anti-parallel across said terminals and that said S-shaped surfaces of each of said devices are adjacent each other.

15. Semiconductor arrangement characterized in that it includes two semiconductor devices according to claim 7, and that said S-shaped surfaces of P+ material of each of said devices are adjacent each other 16. Semiconductor device according to claim 3, characterized in that said first transistor has an elongated emitter with a length dimension greater than its width dimension and that said plurality of individual emitter elements at least partly encircle said elongated emitter, said individual emitter elements being located at a substantially constant distance intervals.

17. Semiconductor device according to claim 16, characterized in that said plurality of individual elements follow a boat-shaped path comprising a straight portion and having two quarter-circle ends so as to surround said elongated emitter at one side.

18. Semiconductor device according to claim 17, characterized in that said elongated emitter substantially has the shape of a rectangle, and said boat-shaped path surrounds the two shorter sides and one longer side of said rectangle.

19. Semiconductor device according to claim 18, characterized in that the emitter of each of said second transistors is constituted by a portion of said path, and that said emitter elements forming said boat-shaped path are each constituted by a region of said material of a first conductivity type and are completely surrounded by said material of a second conductivity type forming a first zone within said boat-shaped path, said boat-shaped path partly surrounding said rectangle which is constituted by a second zone of a material of said second conductivity type, that said first zone comprises a number of individual portions equal in number to the number of second transistors and that said second zone is electrically connected to a first supply conductor, and the regions of each of said portions are electrically coupled to a second supply conductor.

20. Semiconductor device according to claim 32, characterized in that said first field plate is also electrically coupled to said first supply conductor, and said second field plate associated with said portions is also electrically coupled to said second supply conductor.

21. Semiconductor device according to claim 32, characterized in that said first transistor is a PNP transistor and said second transistors are NPN transistors, and that the material of said elements and of said zones is heavily doped N material (N+) and P material (P+) respectively, the material of said wells is slightly doped P material (P−) and said substrate material is very slightly doped N material (N−−), and that the collector of said first transistor and the base of a respective second transistor are constituted by a respective one of said individual portions, and the base of said first transistor and the collector of each of said second transistors are constituted by said substrate.

22. Semiconductor device according to claim 32, characterized in that it includes a turn-on device constituted by a DMOS transistor having a source and drain coupled across the collector-to-emitter path of each of said second transistors and having a source constituted by another individual element of a first conductivity type material embedded in and partly surrounded by the material of said first zone, said DMOS transistor further having a drain which is constituted by said substrate and is separated from said source by a channel of the material of said first well and above which is located a gate of polysilicon material.

23. Semiconductor device according to claim 22, characterized in that said material of said source and drain is heavily doped (N+) and very slightly doped (N−−) N material respectively and said channel material is slightly doped P material (P−).

24. Semiconductor device according to claim 22, characterized in that said other individual element is located near an end of said first zone.

25. Semiconductor device according to claim 22 characterized in that said other individual element is electrically coupled to said second supply conductor via a resistance constituted by a strip of polysilicon material.

26. Semiconductor device according to claim 19, characterized in that said emitters are coupled to said supply conductors by electric conductors which are perpendicular to at least portions of said supply conductors.

27. Semiconductor arrangement including two semiconductor devices, characterized in that said devices are each realized according to claim 17 and are symmetrically disposed with respect to a point.

28. Semiconductor arrangement according to claim 35, characterized in that the one end of the boat-shaped emitter path of the second transistor of each of said two devices faces a portion of the emitter of the first transistor of the other device and is connected therewith via relatively short and wide conductive strips, and that ends of said emitter paths are located close to respective supply terminals and are connected therewith through relatively short and wide conductive strips.

29. Semiconductor arrangement according to claim 5 characterized in that said arrangement further comprises a turn-on device for turning on said thyristor integrated together with said thyristor in an electrically isolated first tub, said turn-off device being integrated in an electrically isolated second tub.

30. Semiconductor thyristor device comprising
a PNP transistor;
an NPN transistor, and
a multi-electrode turn-off device;
   the emitter of said NPN transistor comprising a region of heavily doped N material (N+) embedded in a well of a slightly doped P material (P−),
   a first zoner of heavily doped P material (P+), which makes direct contact with said region along substantially the whole circumference thereof so as to facilitate the deviation of current from below said region into said zone upon said turn-off device being operated,
   said PNP and said NPN transistors being interconnected between two terminals constituting respective emitters of said transistors,
   the collector of said PNP transistor and the base of said NPN transistor being constituted by said well,
   the emitter of said NPN transistor being constituted by said region,
   said controllable multi-electrode turn-off device being coupled across the base-to-emitter junction of said NPN transistor,
   said multi-electrode turn-off device being constituted by a PMOS transistor which has a source constituted by said first zone, a drain constituted by a second zone of heavily doped P (P+) material and between said first and second zones, a serpentine-shaped channel constituted by a slightly doped material of N conductivity type (N−−), a serpentine-shaped gate being arranged above said channel and the edges of said zones.

31. Semiconductor thyristor device including
a first transistor; and
at least one second transistor,
wherein:
   the emitter of each said second transistor is constituted by a region of a highly doped material of a first conductivity type embedded in a well of a material of a second conductivity type;
   the collector of said first transistor and the base of each said second transistor is constituted by said well;
   a first zone of a highly doped material of said second conductivity type completely encircles and is adjacent to and makes direct contact with said region along substantially the whole peripheral surface thereof;
   said first transistor has an elongated emitter substantially in the shape of a rectangle with a length dimension greater than its width dimension and constituted by a second zone of a highly doped material of said second conductivity type;
   each said second transistor has an emitter comprising a plurality of individual emitter elements each constituted by a region which is completely encircled by and is adjacent to said first zone;
   said plurality of individual emitter elements at least partly encircle said elongated emitter, said individual emitter elements being located at a substantially constant distance intervals along a boat-shaped path comprising a straight portion and having two quarter-circle ends so as to surround said elongated emitter at one side, said boat-shaped path surrounding the two shorter sides and one longer side of said rectangle, the emitter of each said second transistor being constituted by a portion of said path;

said emitter elements are each constituted by a region of said material of a first conductivity type and are completely surrounded by said material of a second conductivity type forming a first zone within said boat-shaped path;

said first zone comprises a number of individual portions equal in number to the number of said at least one second transistor;

said second zone is electrically connected to a first supply conductor;

the regions of each of said portions are electrically coupled to a second supply conductor;

said first and second zones are embedded in respective first and second wells of lightly doped material of said second conductivity type within a substrate of a material of said first conductivity type, and a first field plate and a second field plate of polysilicon material are realized above and around the rims of said second zone and well and the rims of said first zone and well respectively.

32. Semiconductor thyristor device including
a first transistor; and
at least one second transistor,
wherein:

the emitter of each said second transistor comprises a region of a highly doped material of a first conductivity type embedded in a well of a material of a second conductivity type;

the collector of said first transistor and the base of each said second transistor is constituted by said well;

a first zone of a highly doped material of said second conductivity type completely encircles and is adjacent to and makes direct contact with each said region along substantially the whole peripheral surface thereof;

said first transistor has an elongated emitter substantially in the shape of a rectangle with a length dimension greater than its width dimension and constituted by a second zone of a highly doped material of said second conductivity type;

each said second transistor has an emitter comprising a plurality of individual emitter elements each constituted by a region which is completely encircled by and is adjacent to said first zone;

said plurality of individual emitter elements at least partly encircle said elongated emitter, said individual emitter elements being located at a substantially constant distance intervals along a boat-shaped path comprising a straight portion and having two quarter-circle ends so as to surround said elongated emitter at one side, said boat-shaped path surrounding the two shorter sides and one longer side of said rectangle, the emitter of each said second transistor being constituted by a portion of said path;

said emitter elements are each constituted by a region of said material of a first conductivity type and are completely surrounded by said material of a second conductivity type forming a first zone within said boat-shaped path;

said first zone comprises a number of individual portions equal in number to the number of said at least one second transistor;

said second zone is electrically connected to a first supply conductor; and the regions of each of said portions are electrically coupled to a second supply conductor;

said semiconductor device further comprising one or more turn-off devices for turning off said transistors, each said turn-off device being consistuted by a PMOS transistor having a source and drain coupled across the base-to-emitter junction of a respective second transistor, said PMOS transistor source and drain being constituted by third and fourth zones of heavily doped P (P+) material respectively and separated by a winding channel of very slightly doped N (N— —) material above which is located a gate of polysilicon material, and that each of said turn-off devices is electrically connected to a respective one of said first zone portions.

33. An arrangement of first and second semiconductor devices, wherein each of said devices includes a first transistor having an elongated emitter with a length dimension greater than its width dimension, as well as a pair of second transistors each having emitters constituted by a plurality of individual emitter elements which at least partly encircle said elongated emitter, said individual emitter elements being located at a substantially constant distance intervals along a boat-shaped path comprising a straight portion and having two quarter-circle ends so as to surround said elongated emitter at one side;

said devices are symmetrically disposed with respect to a point; and the said pair of second transistors of said first semiconductor device and the said pair of second transistors of said second semiconductor device have respective boat-shaped emitter paths whose open sides are directed away from each other.

34. An arrangement of first and second semiconductor devices, wherein each of said devices includes a first transistor having an elongated emitter with a length dimension greater than a width dimension, as well as a pair of second transistors each having emitters constituted by a plurality of individual emitter elements which at least partly encircle said elongated emitter, said individual emitter elements being located at a substantially constant distance intervals along a boat-shaped path comprising a straight portion and having two quarter-circle ends so as to surround one side of said elongated emitter;

said devices are symmetrically disposed with respect to a point; and the respective said boat-shaped emitter paths of said first semiconductor device and of said pair of second transistors have respective open sides which are directed towards each other.

* * * * *

UNITED STATES PATENT AND TRADEMARK OFFICE
CERTIFICATE OF CORRECTION

PATENT NO. : 4,779,125
DATED : October 18, 1988
INVENTOR(S) : Guido P.T.C. Remmerie et al.

It is certified that error appears in the above-identified patent and that said Letters Patent is hereby corrected as shown below:

| | |
|---|---|
| Column 2, Line 16 | After "device", change "it" to -- is --. |
| Column 5, Lines 15, 16 | Between "because" and "particularly", insert -- they are without importance for the invention. More --. |
| Column 5, Line 20 | Change "mateial" to -- material --. |
| Column 6, Line 53 | Change "loer" to -- lower --. |
| Column 7, Line 37 | Change "surrounds" to -- surrounded --. |
| Column 7, Line 54 | Change "P-material" to -- P- material --. |
| Column 8, Line 8 | Change "incrased" to -- increased --. |
| Column 8, Line 15 | Change "idicated" to -- indicated --. |
| Column 9, Line 45 | Change "samll" to -- small --. |
| Column 9, Line 58 | Before "preferably", delete "be". |
| Column 10, Line 13 | Change "Volts" to -- volts --. |
| Column 10, Line 18 | Change "Volts" to -- volts --. |
| Column 10, Line 27 | Change "Volts" to -- volts --. |

UNITED STATES PATENT AND TRADEMARK OFFICE
CERTIFICATE OF CORRECTION

PATENT NO. : 4,779,125
DATED : October 18, 1988
INVENTOR(S) : Guido P.T.C. Remmerie et al.

It is certified that error appears in the above-identified patent and that said Letters Patent is hereby corrected as shown below:

| | |
|---|---|
| Column 10, Line 28 | Change "opeates" to -- operates --. |
| Column 10, Line 46 | Change "N-material" to -- N- material --. |
| Column 10, Line 56 | Change "Dm'" to -- DM' --. |
| Column 10, Line 60 | Change "mm2" to -- $mm^2$ --. |
| Column 12, Line 3 | Change "e.g. 80 micron" to -- e.g., 80 microns --. |
| Column 12, Line 29 | Change "N-" to -- N-- --. |
| Column 12, Line 45 | Change "N-" to -- N-- --. |
| Column 14, Line 4 | Change "FIGG. 13" to -- FIG. 13 --. |
| Column 14, Line 14 | Change "N-" to -- N-- --. |
| Column 14, Line 24 | Change "51" to -- S1 --. |
| Column 14, Line 58 | Change "N-" to -- N-- --. |
| Column 14, Line 59 | Change "shown on" to -- as shown in --. |
| Column 15, Line 4 | Change "N-" to -- N-- --. |

UNITED STATES PATENT AND TRADEMARK OFFICE
CERTIFICATE OF CORRECTION

PATENT NO. : 4,779,125

DATED : October 18, 1988

INVENTOR(S) : Guido P.T.C. Remmerie et al.

It is certified that error appears in the above-identified patent and that said Letters Patent is hereby corrected as shown below:

| | |
|---|---|
| Column 15, Line 13 | Change "N-" to -- N-- --. |
| Column 15, Lines 24, 26 | Change "N-" to -- N-- --. |
| Column 15, Lines 36, 37 | Change "N-" to -- N-- --. |
| Column 15, Line 49 | Change "T1-3" to -- T1-T3 --. |
| Column 17, Line 14 | After "and" and before "that" insert -- said zone comprises heavily doped P (P+) material and --. |
| Column 17, Line 23 | In claim 6, delete "claim 31" and insert therefor -- claim 30 --. |
| Column 17, Line 26 | In claim 7, delete "claim 31" and insert therefor -- claim 30 --. |
| Column 17, Line 60 | In claim 11, delete "claim 31" and insert therefor -- claim 30 --. |
| Column 18, Line 7 | After "transistor", insert a period. |
| Column 18, Line 34 | In claim 14, delete "claim 31" and insert therefor -- claim 30 --. |
| Column 19, Line 6 | In claim 20, delete "claim 32" and insert therefor -- claim 31 --. |
| Column 19, Line 11 | In claim 21, delete "claim 32" and insert therefor -- claim 31 --. |

UNITED STATES PATENT AND TRADEMARK OFFICE
CERTIFICATE OF CORRECTION

PATENT NO. : 4,779,125

DATED : October 18, 1988

INVENTOR(S) : Guido P.T.C. Remmerie et al.

It is certified that error appears in the above-identified patent and that said Letters Patent is hereby corrected as shown below:

Column 19, Line 24　　In claim 22, delete "claim 32" and insert therefor -- claim 31 --.

Column 19, Line 59　　In claim 28, delete "claim 35" and insert therefor -- claim 34 --.

Column 20, Line 13　　Change "zoner" to -- zone --.

Signed and Sealed this

Twenty-fifth Day of July, 1989

Attest:

DONALD J. QUIGG

Attesting Officer　　Commissioner of Patents and Trademarks